(12) United States Patent
Dorst et al.

(10) Patent No.: US 6,604,005 B1
(45) Date of Patent: Aug. 5, 2003

(54) METHOD AND APPARATUS FOR PATH PLANNING

(75) Inventors: Leendert Dorst, Yorktown Heights, NY (US); Karen Irene Trovato, Putnam Valley, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 07/617,303

(22) Filed: Nov. 16, 1990

Related U.S. Application Data

(63) Continuation of application No. 07/442,476, filed on Nov. 22, 1989, now abandoned, which is a continuation of application No. 07/123,502, filed on Nov. 20, 1987, now abandoned.

(51) Int. Cl.$^7$ .............................................. G05B 19/00
(52) U.S. Cl. ...................... 700/56; 700/254; 700/255; 701/23; 701/26; 701/301; 701/310; 706/905; 706/919
(58) Field of Search ................ 901/1, 50; 700/28, 700/56, 245, 250, 253, 254, 255; 701/23, 25, 26, 117, 118, 201–202, 210; 706/905, 919

(56) References Cited

U.S. PATENT DOCUMENTS

| | | | | |
|---|---|---|---|---|
| 4,481,568 A | * | 11/1984 | Inaba et al. | 700/255 |
| 4,482,968 A | * | 11/1984 | Inaba et al. | 364/513 |
| 4,674,048 A | * | 6/1987 | Okumura | 901/1 |
| 4,764,873 A | * | 8/1988 | Libby | 364/513 X |
| 4,862,373 A | * | 8/1989 | Meng | 700/178 |
| 5,751,573 A | * | 5/1998 | Cameron et al. | 700/56 |
| 5,764,510 A | * | 6/1998 | Cameron et al. | 700/56 |

OTHER PUBLICATIONS

Lumelsky is related to Dynamic Path Planning for a Planar Articulated Robot Arm Moving Unknown, Automatica, vol. 23, No. 5, pp. 551–570 (1987) wnich is recited in this US Patent Application by the applicant.*

Lumelsky is related to Algorithmic and Complexity issues of Robots Motion in an Uncertain Environment, Journal of Complexity 3, 146–182 (1987) wnich is recited in this US Patent Application by the applicant.*

NASA's Jet Propulsion Laboratory—"Processor Would Find Best Paths on Map"—NASA Tech Briefs, May 1990, pp. 40–41.*

Oussama Khatib, "Real–Time Obstacle Avoidance for Manipulators and Mobile Robots", The International Journal of Robotics Research pp 90–98, vol. 5, No. 1 (Spring 1986).

N. J. Nilson, *Principles of Artificial Intelligence*, (Tioga Pub. Comp. Calif. 1980).

B. J. HVerwer, Abstract, $3^{rd}$ Conf on Artificial Intell. for Space Applications (Nov. 1, 1987) p. 153.

B. J. H. Verwer, unpublished paper, "Heuristic Search in Robot Configuration Space Using Variable Metric".

Ichikawa et al—"A Heuristic Planner and an Executive for Mobile Robot Control"—IEEE Trans. on systems, Man and Cybernetics, vol. smc–15, No. 4, Jul./Aug. 1985, p 558–563.*

Dorst et al.—"The Constrained Distance Transformation: a Pseudo–Euclidean Recursive Implementation of the LEE-Algorithm", *Signal Processing III: Theories and Applications*;Elsevier Science Publishers B. (North Holland);1986; p 917–920.*

Verbeek et al—"Collision Avoidance and Pathfinding Through Constrained Distance Transformation in Robot State Space", Proc. Conf. 8–11, Dec. 1986 Amsterdam-(North Holland) p. 627–634.*

* cited by examiner

*Primary Examiner*—Ramesh Patel

(57) ABSTRACT

A method and apparatus for path planning are presented. Path planning involves propagating cost waves in a configuration space representation of a task space. A space variant metric and budding are used for cost wave propagation. The disclosed method and apparatus are readily adaptable to robots with n degrees of freedom.

32 Claims, 34 Drawing Sheets

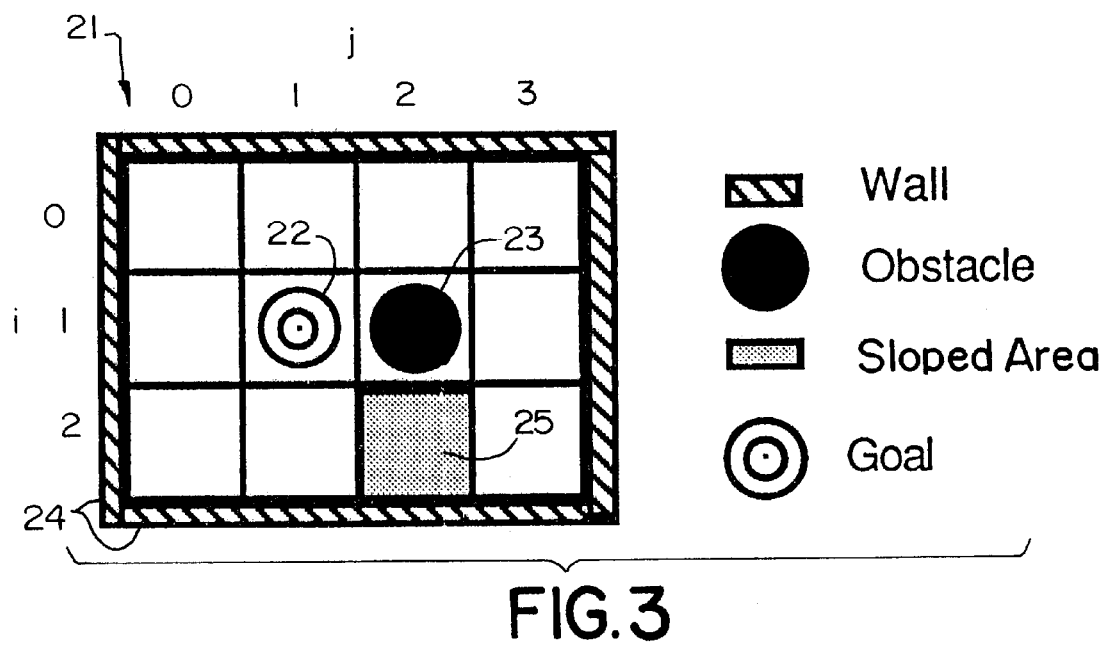
FIG. 3
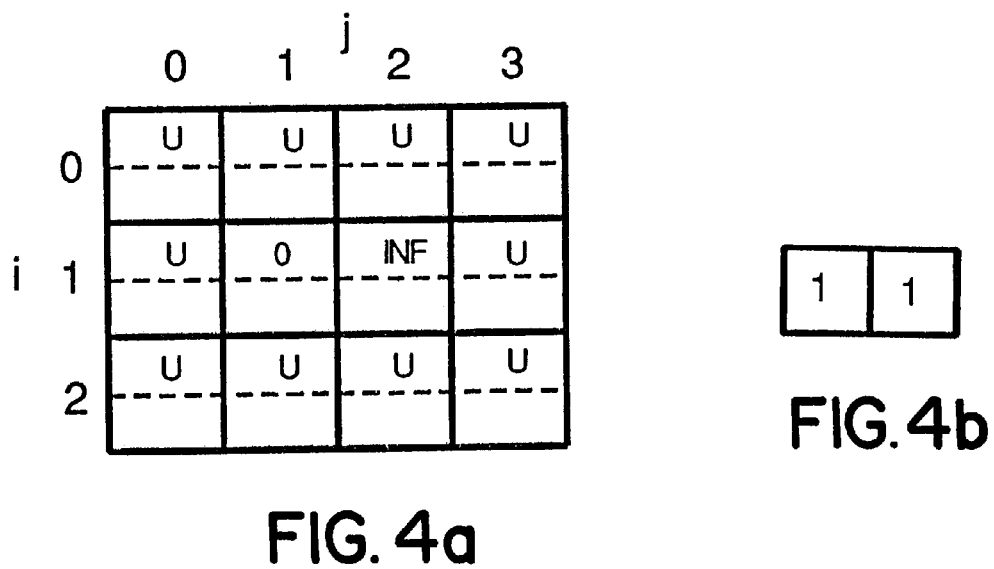
FIG. 4a
FIG. 4b

Configuration Space:

|   | 0 | 1 | j 2 | 3 |
|---|---|---|---|---|
| 0 | U | U | 1.4 ▲ | U |
| i 1 | U | 0 | INF | U |
| 2 | U | U | U | U |

Heap:

| 0 | 2 | 1.4 |

Configuration Space:

|   | 0 | 1 | j 2 | 3 |
|---|---|---|---|---|
| 0 | 1.4 ◄ | 1 ▼ | 1.4 ▲ | U |
| i 1 | 1 ► | 0 | INF | U |
| 2 | 1.4 ▼ | 1 ▲ | 2.8 ▼ | U |

Heap:

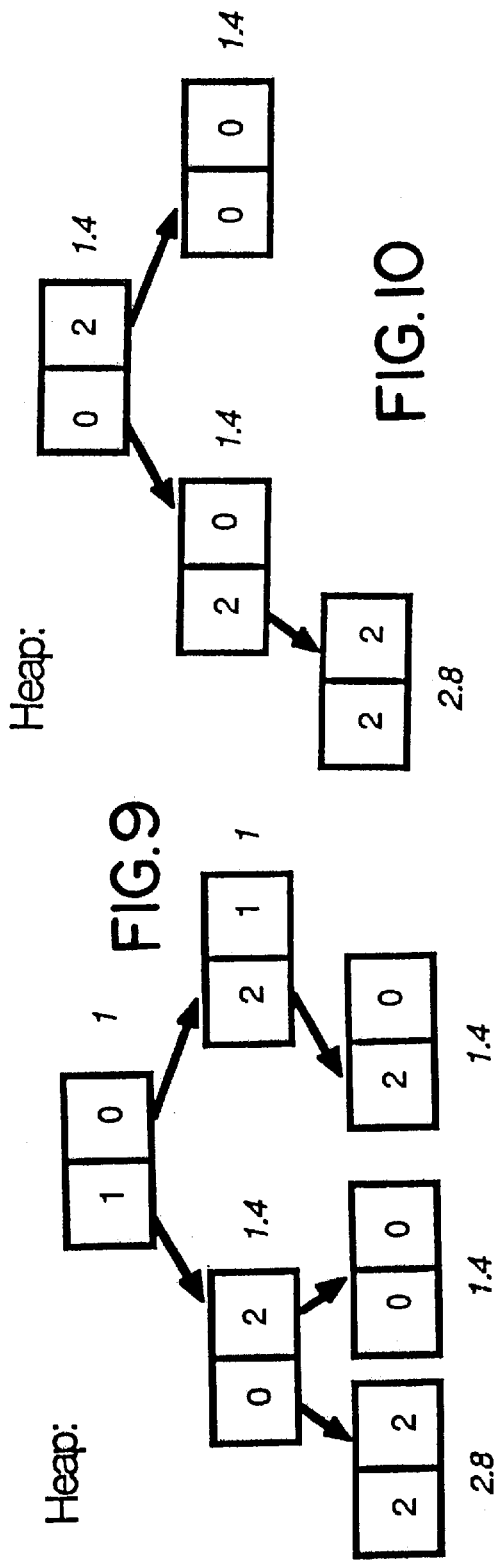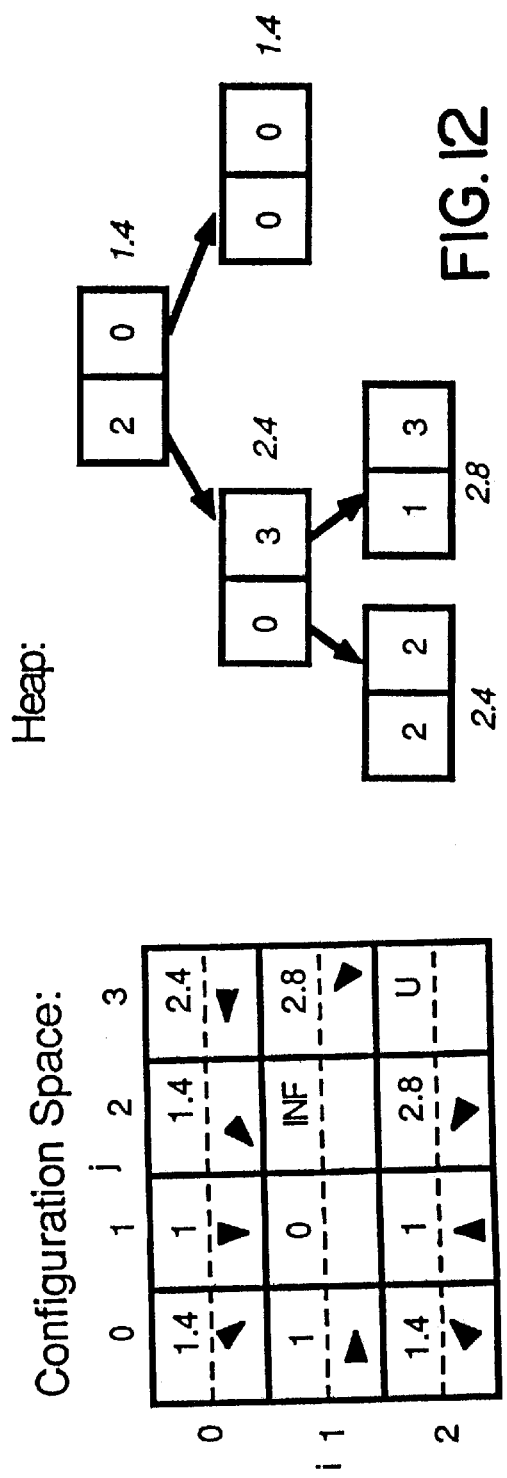

Configuration Space:

Heap:

Configuration Space:

Configuration Space:

FIG.19

Transition Costs

METHOD AND APPARATUS FOR PATH PLANNING

This is a continuation of application Ser. No. 07/442,476, filed Nov. 22, 1989 abandoned, which is a continuation application of Ser. No. 07/123,502, filed Nov. 20, 1987, abandoned.

A portion of the disclosure of this patent document contains material which is subject to (copyright or mask work) protection. The (copyright or mask work) owner has no objection to facsimile reproduction by anyone of the patent document or the patent disclosure, as it appears in the Patent And Trademark Office patent file or records, but otherwise reserves all (copyright or mask work) rights whatsoever.

The present application incorporates by reference the computer program listing in the appendix on one compact disc. The file names on the disk are borderline.c—6 KB;
bud.c—8 KB;
canvas.c—20 KB;
copyright.1989—1 KB;
defines.h—7 KB;
demo.c—1 KB;
externs.h—12 KB;
globals.h—11 KB;
init.c—4 KB;
interpol.c—18 KB;
metric.c—2 KB;
path.c—5 KB;
print.c—2 KB;
show.c—11 KB;
trafo_data.c—10 KB .

The CD-ROM lists the creation date of the files as December 23, 2001, which was the date of the creation of the compact disc layout. The files were copied onto the compact disc on December 25, 2001.

BACKGROUND OF THE INVENTION

1. Field of the Invention

The invention relates to planning an optimal path for an object to follow from a given start point to a nearest one of a set of goals, taking into account constraints and obstacles.

2. The Prior Art

One of the most important outstanding problems in robotics is that of path planning with obstacle avoidance. In a typical task, the robot has to move from a start location to a goal location. Obstacles should be avoided along the way, and the movement as a whole should be as efficient as reasonably possible. The planning of the path should be as rapid as possible. The problem of providing such a "path" for a robot, for instance by giving a series of set points, is called the path planning problem.

There are a number of existing robots. Typically they are controlled using a programming language. One commonly used language is Val II, described in Unimation, Inc., "Programming Manual: User's Guide to Val II: Version 2.0 398AG1", December 1986. Val II can be used to control products such as Unimation's Puma Robots and Adept Robots. Using Val II, a user can specify the movement of a robot, from a current point to a desired point, using the command MOVE POINT () on page 4–20 of the reference. Points are usually generated in joint coordinates. It is therefore sufficient for a path planning method to generate a series of set points to be inserted in the appropriate Val II command. The technology is in place for the robot to follow a path once the set points are generated.

Typical industrial robots use manually generated set points. Such manually generated set points are adequate for performing a simple repetitive task such as automated assembly in an environment which does not change from one task to the next. Manually generated set points are not practical and paths followed are often not efficient for dynamic situations, or for situations with large numbers of obstacles, or for obstacles with complex shapes. Therefore there is a need for a method to generate set points automatically.

One known method automatically generates a set of points along an optimal path. The set of points allows a robot to get from a start point to one of a set of goal points. One goal point is chosen over the others because it minimizes movement of the robot. This known method is disclosed in L. Dorst et al., "The Constrained Distance Transformation, A Pseudo-Euclidean, Recursive Implementation of the Lee-algorithm", *Signal Processing III* (I. T. Young et al. eds; Elsevier Science Publishers B. V., EURASIP 1986) ("L. Dorst et al."); and P. W. Verbeek et al., "Collision Avoidance and Path Finding through Constrained Distance Transformation in Robot State Space", Proc. Conf. Dec. 8–11 1986, Amsterdam pp. 627–634. The known method plans paths in the configuration space of the robot. Obstacles to robot movement are represented by forbidden states in configuration space. In this space, the series of set points is represented in so-called joint coordinates, this is a set of coordinates that can be used to drive the joints of the robot directly. No complicated coordinate transformations are needed. An advantage of the known method is the simplicity with which it can be expanded to greater numbers of degrees of freedom.

In the prior art, the path in configuration space is found in three steps:

1) A transformation is made of the obstacles and the goals of the robot from points in task space to states in configuration space, The configuration space is discretized.

2) A cost field is created, specifying the total cost needed to reach the closest goal state at each state in configuration space. The particular method used to produce the cost field is described in L. Dorst et al. The method is a repeated scanning of the complete configuration space, while performing a basic cost propagation operation at each state.

3) From the start state, steps are taken in the direction of the cost gradient of the cost field until the goal state is reached. The states passed on the way form the shortest path from start to goal, and can be used as the series of set points.

Steps 1) and 2) are performed only once for a given robot and a given set of obstacles and goals. Using the same cost field, Step 3) can be performed for different start states.

The prior art method has a number of disadvantages. First, in step 2), the whole configuration space has to be scanned several times. Second, the kinds of cost metrics considered are restricted. In particular the cost of transitions between states in configuration space are considered to be the same for a given direction independent of the state at which cost is calculated. These restrictions limit practical applications. For instance, it is not possible to find a path for a robot arm with revolute joints that will result in minimal movement of an end-effector. Minimal time paths are only possible for a few robots which are of limited practical application. A third disadvantage is that following the gradient requires computation of the gradient at every point of the path.

SUMMARY OF THE INVENTION

It is an object of the invention to avoid repeated scanning of the configuration space during creation of the cost field.

It is a second object of the invention to allow use of cost metrics which vary at different states in configuration space. An example of this would be a cost function which allows minimization of the movement of the effector end of the robot.

It is a third object of the invention to avoid computation of the gradient at every state during establishment of a path.

It is a fourth object of the invention to create a path planning method which is easily adaptable to multiple degrees of freedom.

These objects are achieved according to the invention by a process referred to herein as "budding."

These objects are further achieved according to the invention by the use of cost metrics which are referred to herein as "space-variant metrics."

These objects are still further achieved according to the invention by a process referred to herein as "following the direction arrows".

These objects are further achieved according to the invention by using the space-variant matrices in a multi-dimensional configuration space.

Further objects and advantages of the invention will become apparent in the remainder of the application.

BRIEF DESCRIPTION OF THE DRAWING

These and other aspects of the invention are described herein with reference to the selected embodiments illustrated in the following figures.

FIG. 3 is a plan of a highly simplified task space.

FIGS. 4a, 5, 7, 11, 13, 15 and 16 illustrate the progressive organization of a configuration space corresponding to the highly simplified task space by the method called "budding".

FIGS. 4b, 6, 8, 9, 10, 12 and 14 illustrate the progressive building of a heap during organization of the configuration space.

FIG. 19 shows the metric for the whole highly simplified configuration space.

DETAILED DESCRIPTION OF THE PREFERRED EMBODIMENT

A. Definition of Some Terms

A robot has degrees of freedom. The degrees of freedom are the independent parameters needed to specify its position in its task space, Some examples follow. A hinged door has 1 degree of freedom. In other words, any position can be characterized by one parameter, an opening angle. A robot which moves freely over a factory floor has two degrees of freedom, for instance the x- and y-position coordinates. An object in space can be considered to have six degrees of freedom. The 6 independent parameters that need to be specified are three position coordinates and three orientation angles. Therefore in order for a robot to be capable of manipulating an object into an arbitrary position and orientation in space, the robot must have at least six degrees of freedom. An example of a commercially available robot with six degrees of freedom is the Puma 562, manufactured by Unimation, Inc.

A rotational degree of freedom is a degree of freedom that corresponds to an angle about a rotation axis of a robot joint. A rotational degree of freedom is a periodic parameter with values running from 0° to 360°; i.e. 360° corresponds to the same configuration of the robot as does 0°. Translational degrees of freedom correspond to non-periodic parameters that can take on values over an infinite range. Usually, however, the ranges of both rotational and translational degrees of freedom are limited by the scope of the robot.

The "configuration space" of a robot is the space spanned by the parameters of the robot. The configuration space has one dimension for each degree of freedom of the robot. Herein, a point in configuration space will be called a "state". Each "state" in an n-dimensional configuration space is characterized by a set of n values of the n robot degrees of freedom. A robot in the position characterized by the set of values is in a certain configuration. The set of states in the configuration space correspond to the set of all possible robot configurations.

For the purpose of computation, the configuration space is "discretized". This means that only a limited number of states are used for calculations.

Figure 2:
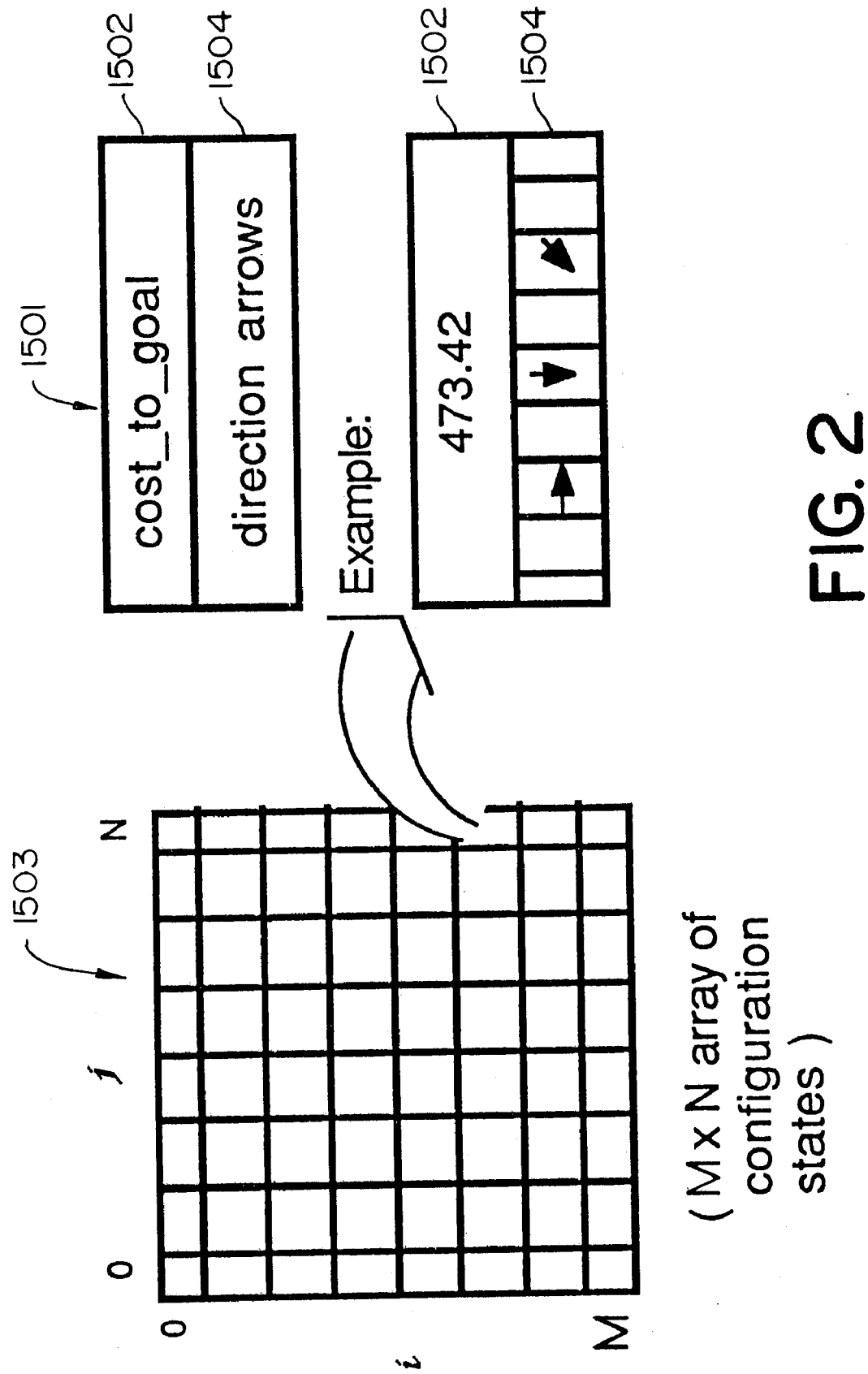
FIG. 2 shows a data structure used as a configuration space.

FIG. 2 shows a data structure 1503 which is used as the configuration space of a robot with two degrees of freedom. Data structure 1503 is an M×N matrix of configuration states. The states are identified by their indices (i,j), where i represents a row number and j represents a column number. Each state (i,j) is itself a data structure as shown at 1501 and has a cost_to_goal field 1502 and a direction_arrows field 1504. These fields are filled in by "budding" as described below. The cost_to_goal field 1502 generally contains a number which represents the cost of transition to get from the present state to a nearest "goal state". "Goal states" represent potential end points of the path to be planned.

The cost of a transition in configuration space is a representation of a "criterion" or constraint in task space. A criterion is a cost according to which a user seeks to optimize. Examples of criteria that a user might chose are: amount of fuel, time, distance, wear and tear on robot parts, and danger.

The direction_arrows field 1504 can contain zero or more arrows which indicate a direction of best transition in the configuration space from the present state to a neighbor state in the direction of the goal state resulting in a path of least total cost.

Arrows are selected from sets of permissible transitions between neighboring states within the configuration space.

The term "neighbor state" is used herein to mean a state which is removed from a given state by a single permissible transition. One set of arrows could be {up, down, right, left}, where, for instance, "up" would mean a transition to the state immediately above the present state. Another set of arrows could be {NORTH, SOUTH, EAST, WEST, NE, NW, SE, SW}. Yet a third set of arrows could be {$\overline{(0,1)}$, $\overline{(1,0)}$, $\overline{(0,-1)}$, $\overline{(-1,0)}$, $\overline{(1,1)}$, $\overline{(1,-1)}$, $\overline{(-1,1)}$, $\overline{(-1,-1)}$, $\overline{(1,2)}$, $\overline{(-1,2)}$, $\overline{(1,-2)}$, $\overline{(-1,-2)}$, $\overline{(2,1)}$, $\overline{(-2,1)}$, $\overline{(2,-1)}$, $\overline{(-2,-1)}$}. It is noted that the arrows "up", "NORTH", and "$\overline{(-1,0)}$", are all representations of the same transition within the configuration space. In general one skilled in the art may devise a number of sets of legal transitions according to the requirements of particular applications. Once a set of legal transitions is devised any unambiguous symbolic representation of the set of permissible transitions can serve as the direction arrows. In the case of the directions $\overline{(1,2)}$, $\overline{(-1,2)}$, $\overline{(1,-2)}$, $\overline{(-1,-2)}$, $\overline{(2,1)}$, $\overline{(-2,1)}$, $\overline{(2,-1)}$ and $\overline{(-2,-1)}$, transition to a "neighbor" state in a two dimensional matrix 1503 actually requires a "knight's move", as that term is known from the game of chess. For example (1, −2) represents the move in the neighbor direction "down one and left 2".

In the configuration space, a metric is defined. The "metric" specifies for each state in configuration space the cost of a transition to any neighboring state. This metric may be specified by a function. For instance, a locally Euclidean metric can be defined as follows. At a state (i,j), the cost of a transition in a neighbor removed from (i,j) by direction arrow $\overline{(di,dj)}$ is given by $\sqrt{di^2+dj^2}$. In other situations, it is more convenient to compute the metric in advance and store it. Obstacles can be represented in the metric by transitions of infinite cost. A transition between two arbitrary states must take the form of a series of transitions from neighbor to neighbor. The cost of any arbitrary path from a start state to a goal state is the sum of the costs of transitions from neighbor to neighbor along the paths.

In budding, a standard data structure called a heap is used to maintain an ordering of states. This is only one of many possible schemes for ordering, but the heap is considered to be the most efficient schedule for implementations with a small number of parallel processors. Heaps are illustrated in FIGS. 4b, 6, 8, 9, 10, 12 and 14. The heap is a balanced binary tree of nodes each representing a configuration state. In the preferred embodiment, the nodes actually store the indices of respective configuration states. In the heap, each parent state e.g. at 601 has a lower cost_to_goal than either of its two children states e.g. at 602. Therefore, the state at the top of the heap, e.g. at 600, is that with the least value of cost_to_goal. Heaps are well known data structures, which are maintained using well known methods. One description of heaps and heap maintenance may be found in Aho et al., *The Design and Analysis of Computer Algorithms*, (Addison-Wesley 1974) pp. 87–92. In an alternate embodiment, other ways of ordering states may be used during budding. For instance, a queue can be used. This means that modes are not necessarily budded in order of lower cost.

B. Overview of the Method

Figure 1A:
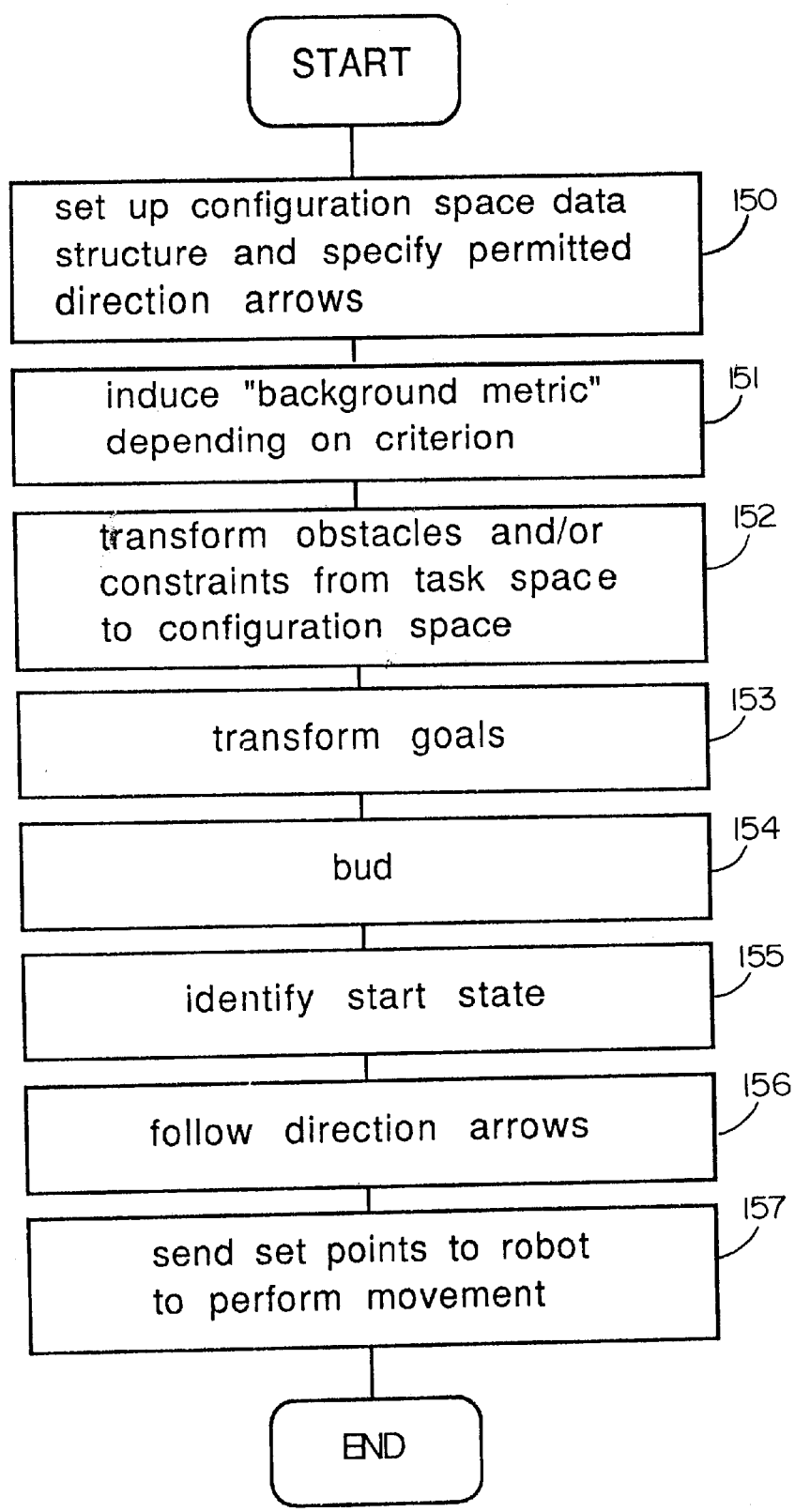
FIG. 1a is a high level flowchart giving a conceptual view of the method of path planning.

FIG. 1a gives a general overview of steps used in generating a series of set points using the method of the invention.

In box 150 the configuration space is set up and permitted direction arrows are specified. One skilled in the art might devise a number of ways of doing this.

One option offered by the method is that of specifying aspects of the configuration space interactively. The number of states in a configuration space might be chosen to reflect how finely or coarsely a user wishes to plan a path. The set of direction arrows may be chosen to be more complete to get finer control of direction. The set of direction arrows may be chosen to be less complete if speed of path planning is more important than fine control of direction.

Other ways of specifying the configuration space and direction arrows are to code them into a program or hardwire them into circuitry. These options provide for less flexibility, but can result in increased processing efficiency.

In box 151, a "background metric" is induced by a criterion. A background metric is one which applies throughout a configuration space without taking into account local variations which relate to a particular problem. Another option offered by the method is to specify the transition costs interactively.

In box 152 obstacles and constraints are transformed from task space to configuration space. This transformation generates obstacle states and/or constraint states. In addition or alternatively the transformation can represent obstacles and constraints as part of the metric. Boxes 151 and 152 are represented as separate steps in FIG. 1a, but in fact they can be combined.

In box 153, goals are transformed from points in task space to one or many goal states in configuration space.

In box 154 "budding" occurs. "Budding" is explained below. Budding results in filling the direction_arrows fields of the configuration space with direction arrows.

In box 155, a start state is identified. The start point in task space can be input by a user, or it can be sensed automatically, where applicable. This start point must then be transformed into a state in configuration space. If robot encoders are read, or the command WHERE in Val II is used, one obtains the parameters of the start state immediately, without any need for transformations. The WHERE command returns the joint encoder angles in degrees.

In box 156, the method follows the direction_arrows set up in box 154 from the start point indicated in box 155 to the goal state. The path states passed through in box 156 are sent to a robot at 157. The path can be sent in the form of set points. Each set point can then be a parameter of a MOVE POINT() command in Val II. The set points can be transformations into task space of the path states passed through in box 156. In an appropriate application, the set points can be the path states themselves. As will be discussed below, in some applications the set points need not be used to direct a robot. They can also be used as instructions to human beings.

Figure 1B:
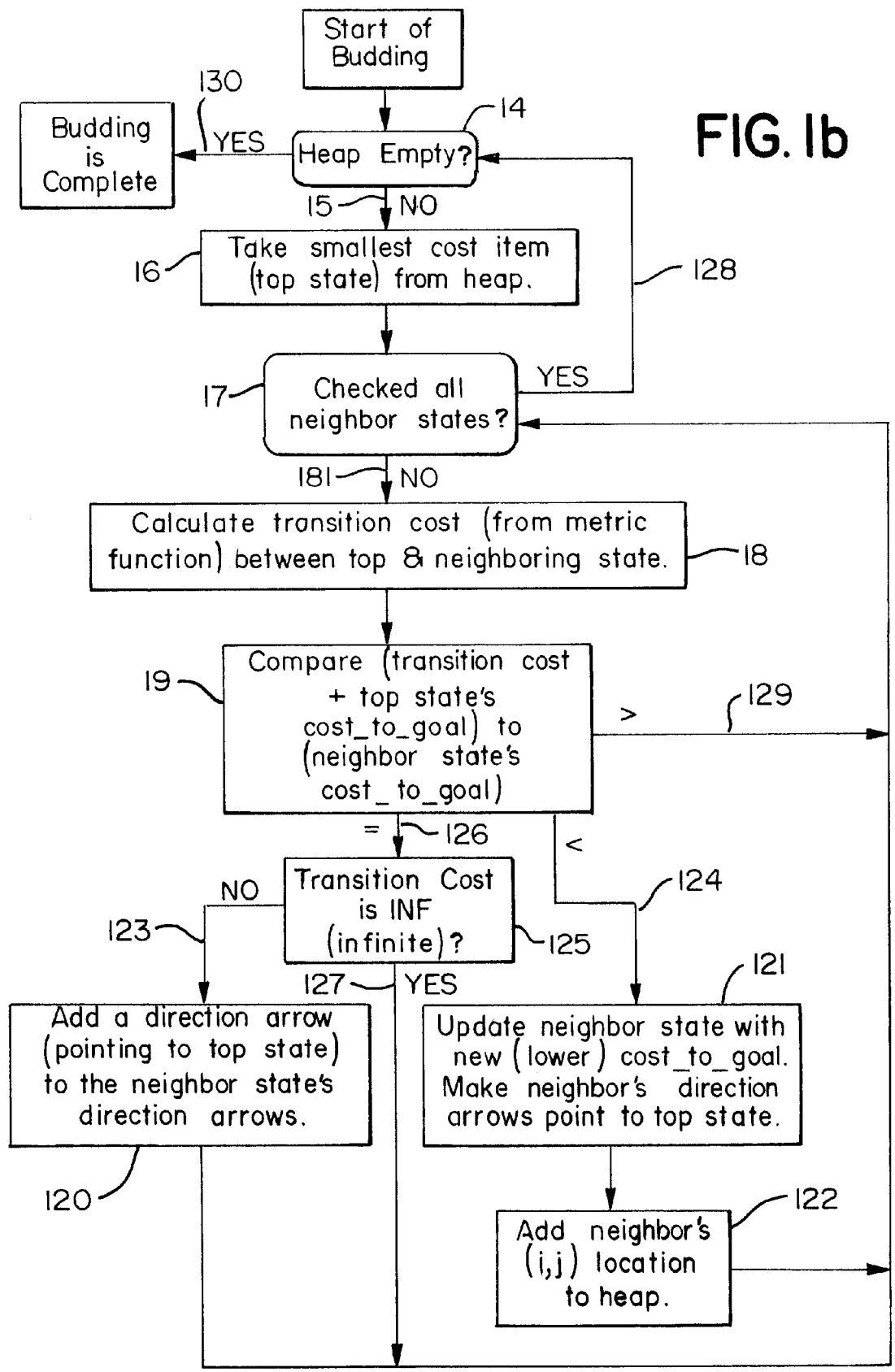
FIG. 1b is a more detailed flowchart of a part of a method of path planning.

FIG. 1b expands box 154 of FIG. 1a.

The method described in the flowchart of FIGS. 1a and 1b is applicable to a large number of different situations. In what follows, the application of the method to a simple example is described first. Then the application of the method to more complicated examples will be described.

C. Applying Budding to a Simple Factory Floor

FIG. 3 represents a factory floor 21 on which a robot is to travel. The map of the actual room is called a "task space". The floor consists of cells. There are four cells horizontally and three cells vertically. The robot moves from cell to cell, in any of 8 directions: horizontally, vertically, or diagonally. The factory floor is bounded by walls 24. There is a pillar 23 which is an obstacle to the movement of the robot. In cell 25, the floor sags. The sagging floor in cell 25 is a constraint to the movement of the robot. The cell 22 is the "goal cell". The problem to be solved is to find the fastest path from any cell to the goal cell 22.

FIG. 4a is a configuration space representation of the task space of FIG. 3. Configuration space represents the combination of all the parameters of the task space. It is noted that the configuration space has twelve configuration states, (0,0), (0,1), (0,2), (0,3), (1,0), (1,1), (1,2), (1,3), (2,0), (2,1), (2,2), and (2,3), described by the i and j locations on the factory floor and denoted as (i, j). Each configuration state has a cost_to_goal field 1502 and a direction_arrows field 1504, as shown in FIG. 2. The set of arrows to be used in the direction_arrows field 1504 are {$\overline{(0,1)}$, $\overline{(-1,1)}$, $\overline{(-1,0)}$, $\overline{(-1,-1)}$, $\overline{(0,-1)}$, $\overline{(1,-1)}$, $\overline{(1,0)}$, $\overline{(1,1)}$} (or {E, NE, N, NW, W, SW, S, SE)}, which correspond to the 8 directions in task space. In this example, moving from one state to a neighbor state in the configuration space of FIG. 4a corresponds to moving from cell to cell in the task space of FIG. 3.

Because of the simplicity of the current example, and because of the particular geometry, the task space of FIG. 3 and the configuration space of FIG. 4a are very similar. It will not generally be the case that the task and configuration spaces are so similar.

Although the path planning problem given is that of moving from a starting position to a goal position, the solution is actually found by propagating cost waves starting at the goal toward the start. The transition cost for moving from state "a" to a state "b" calculated during "budding" represents the cost that will be incurred while following the path states through b to a.

"Propagating cost waves", here, is treating layer after layer of unprocessed states. If a queue is used to schedule budding, unprocessed states are treated first in, first out. If a heap is used, then the lowest cost node will always be budded first.

In the simple factory floor example, 'time' is taken to be the cost criterion of movement. It is assumed that the horizontal or vertical movement from cell to cell in the task space generally takes one unit of time. A diagonal movement generally takes √2 units of time, which can be rounded off to 1.4 units of time.

It is important to notice that the transition cost of movement is not commutative (that is, there may be different costs for moving from (2,2) to (1,1) and from (1,1) to (2,2). For instance in the case of the sagging floor 25, it takes longer to move out of the cell than into the cell. In the example we assume that in a horizontal or vertical direction, it takes 2 units of time to climb out of the cell. In a diagonal direction it takes 2.8 units of time to climb out of the cell. However, the cost into the sagging floor area 25 is taken to be the same as a normal movement. It is assumed for this simple problem that the robot slows down when moving uphill, but does not go faster downhill.

The metric for transition costs between states of the configuration space is different from the cost criterion of movement in the task space, because cost waves are propagated from goal state to start state, in other words the transition costs are associated with transitions in configuration space.

Figure 18:
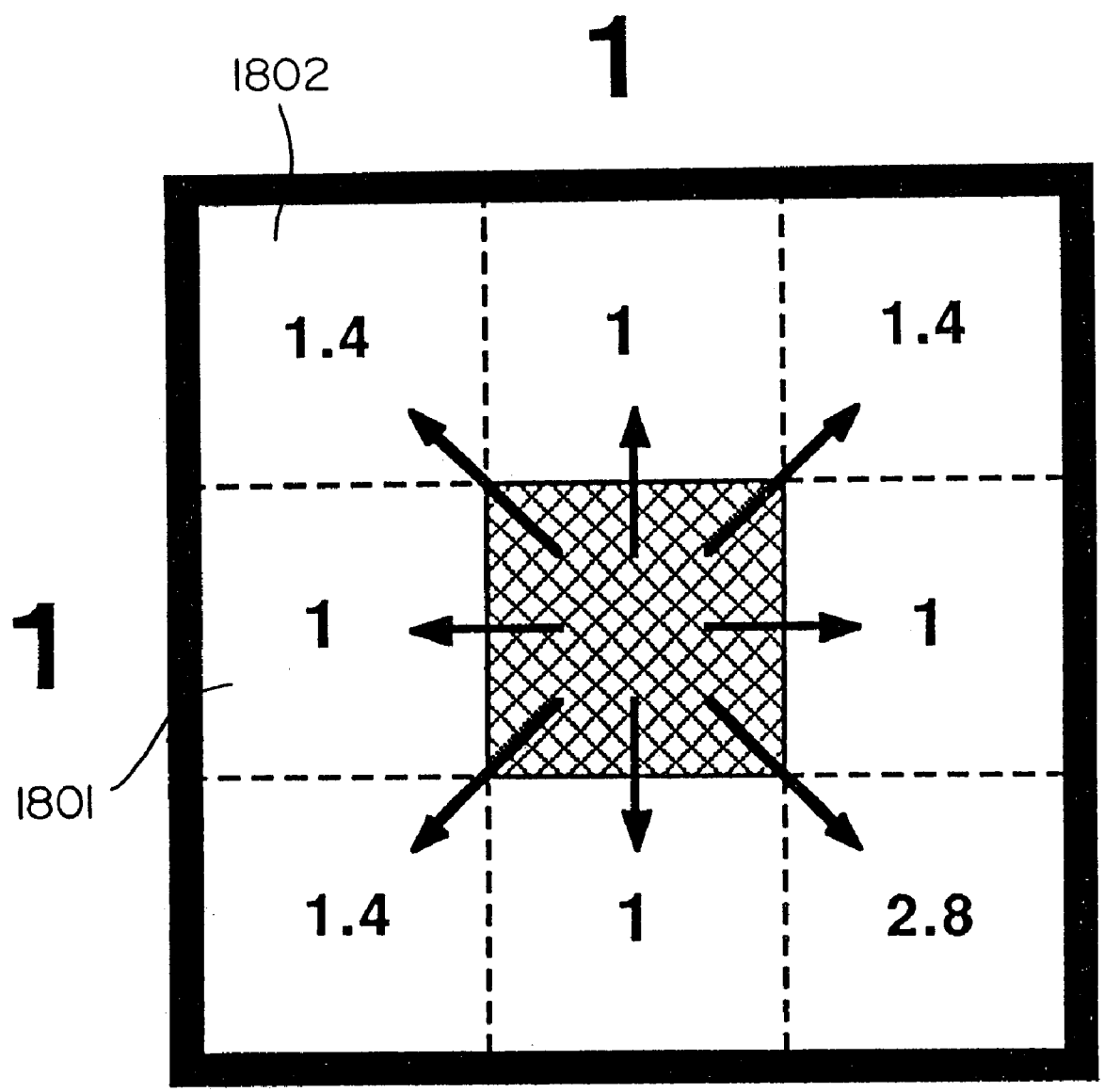
FIG. 18 shows a metric for one state of the highly simplified configuration space.

The data structure of FIG. 18 illustrates the value of the metric applicable to state (1,1) of the configuration space of FIG. 4a. In FIG. 18, a data structure is shown which illustrates the value of the metric applicable to state (1,1) of the configuration space of FIG. 3. State (1, 1) corresponds to the goal cell 22. A transition from state (1,1) to state (1,0) indicated at 1801 would take one unit of time and therefore has a cost of one. A transition from state (1,1) to state (0,0) indicated at 1802 has a cost of 1,4. A transition from state (1,1) to state (2,2) has a cost of 2.8, indicated at 1803. This transition cost indicates that climbing out of the sagging floor area 25 to the goal 22 costs 2.8 units of time. The transition cost of FIG. 18 represents the cost criterion of movement in the task space, in a direction opposite to the transition.

Figure 19:
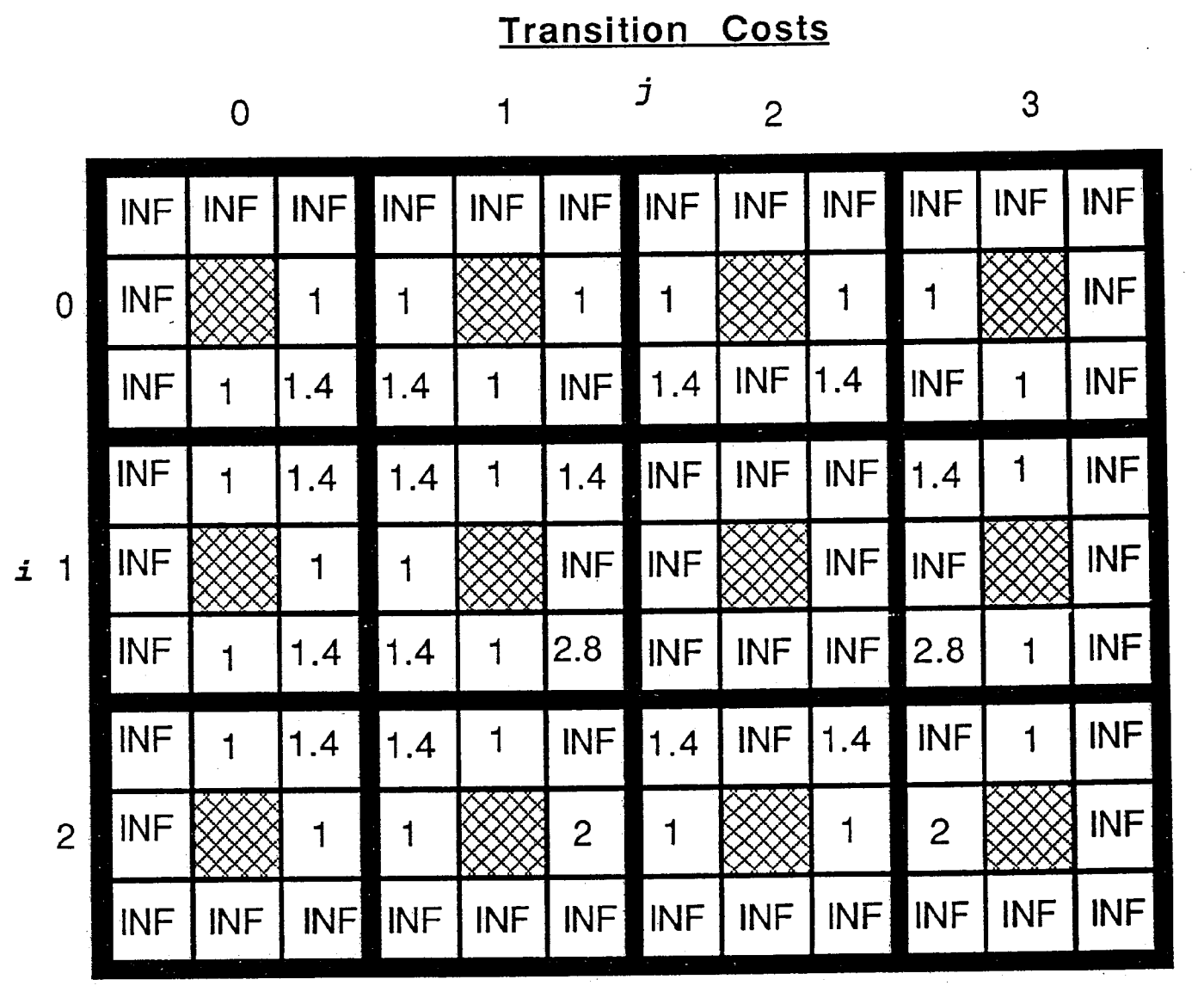

The data structure of FIG. 19 illustrates the values of the metric applicable to the entire configuration space of FIG. 4a.

It is impossible to move into the walls bounding the task space. Another way of stating this is that it takes an infinite amount of time to move into or out of the wall. Therefore the transitions in configuration space corresponding to such movements in task space have a cost "INF". The notation "INF" is used to indicate the largest number that can be represented in the device in which the method is implemented (e.g. in a computer). Examples of the costs of moving out of the walls are illustrated in the outer border of FIG. 19, for instance at 1901. The same cost INF is assigned for movements out of the state (1,2) corresponding to the pillar. This is illustrated in state (1,2) of FIG. 19. It is noted that in state (2,2) the transition costs appear to be normal, even though this state represents the sagging floor 25. Again, the increased costs appear in the neighboring states (1,1), (2,1), (1, 2), (1,3), and (2,3). Cost of movement out of the sagging floor area 25 is increased. However, the increased costs appear in the neighboring states, because transitions during cost wave propagation are in a direction opposite to movement in the task space.

With the introduction of the obstacles and of the constraint of the sagging floor, the metric of FIG. 19 has become different depending on location in configuration space. It is now of the type referred to herein as a "space-variant metric".

In box 150 of FIG. 1a, uncosted values U are assigned to the cost_to_goal field of each configuration state, and all the direction_arrows fields are cleared.

In box 152 infinite values INF are set in the cost_to_goal field of configuration states (1,2) which represent obstacles such as the pillar 23. Since FIG. 4a is a highly simplified example, there is only one obstacle (1,2). In addition, the bounding walls 24 are obstacles. However, there are often many more obstacles in a real situation.

Box 153 assigns zero 0 to the cost_to_goal fields of the configuration states which represent goals (1,1). Since FIG. 4a represents a highly simplified example, there is only one goal (1,1) shown. However, in a real world example there may be many goals. Also in box 153, the indices of the goals (1,1) are added to a heap. Standard methods of heap maintenance are employed for addition and removal of states to/from the heap. As a result, the state with the lowest cost will always be the top state of the heap. In the example of FIG. 4a, the sample goal has indices (1,1). Therefore, the indices (1,1) are added to the heap. In a more complicated example, with more goals, the indices of all the goals are added to the heap. FIG. 4a illustrates the configuration space after the completion of boxes 150, 151, 152, and 153 of FIG. 1a. FIG. 4b illustrates the corresponding heap.

Box 14 of FIG. 1b checks to see if the heap is empty. In the example of FIG. 4b, the heap is not empty. It contains the indices (1,1) of the goal. Therefore the algorithm takes the NO branch 15 to box 16.

Box 16 takes the smallest cost item from the heap (top state), using a standard heap deletion operation. In the example of FIG. 4a, the goal (1,1) is the current smallest cost item, with a cost of 0.

Box 17 tests whether all the neighboring states have been checked. Neighbor states are those states which are immediately adjacent to the top state. In the case of FIG. 4a the neighbor states at the present stage of processing are the states (0,0), (0,1), (0,2), (1,0), (1,2), (2,0), (2,1), and (2,2). So far, the neighboring states have not been checked. Therefore the method takes the NO branch 181 from box 17.

In box 18 the transition cost between the top state and its neighboring states is calculated using the metric function.

The transition cost between state (1,1) and state (0,2) is 1.4. Transition costs from state (1,1) to states (1,0), (2,0), (2,1), (2,2), (0,1), and (0,0) are calculated analogously, and are respectively 1, 1.4, 1, 2.8, 1, 1.4. The transition from the top state (1,1) to the obstacle state (1,2) is INF. These are given here beforehand for convenience; but box 18 calculates each of these transition costs one at a time as part of the loop which includes boxes 17, 18, 19, 120, 121, 122, and 125.

Box 19 compares the sum of the transition cost and the contents of the cost_to_goal field of the top state with the contents of the cost_to_goal field of the neighboring state. In the case of top state (1,1) and neighboring state (0,2) in FIG. 4a, the transition cost is 1.4 and the contents of the cost_to_goal field of the top state are 0. The sum of 1.4 and 0 is 1.4. The contents of the cost_to_goal field of the state (0,2) are currently U, uncosted, indicating that state (0,2) is in its initialized condition. One way to implement "U" is to assign to the cost_to_goal field a value which exceeds the largest possible value for the configuration space, other than INF. Performing the comparison in Box 19 thus gives a comparison result of "<". Therefore the method takes branch 124 to box 121. Following branch 124 will be referred to herein as "improving" a state.

Figures 5, 6, 7, 8:
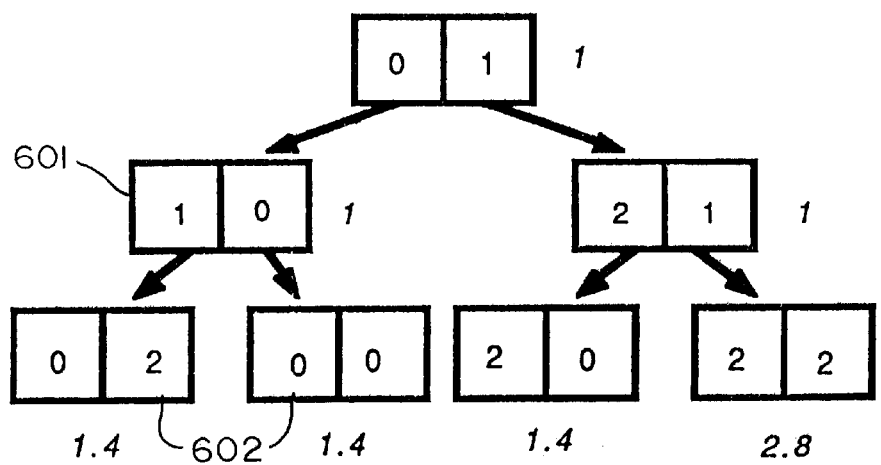

In box 121 the cost_to_goal field of the neighbor state is updated with the new (lower) cost_to_goal, i.e. the sum of the transition cost and the contents of the cost_to_goal field. In other words, for the state (0,2), the cost_to_goal field is updated to 1.4. In addition, box 121 adds an arrow pointing to the top state in the direction_arrows field of the neighboring state. In the case of state (0,2), the arrow added is $(\overline{1,-1})$. The downward direction on the figure corresponds to an increase in the first value of the direction_arrow field. The results of box 121 on state (0,2) are illustrated in FIG. 5.

In box 122, which follows box 121, the indices (i,j) of the neighboring state (0,2) are added to the heap. This is illustrated in FIG. 6. The cost values are noted next to the state indices, for reference, but are not actually stored in the heap.

The method now returns control to box 17. This return results in a loop. The method executes boxes 17, 18, 19, 121, and 122 for each of the neighboring states, other than the obstacle. For the obstacle, the method takes branch 126 to box 125. Since the transition cost is infinite, branch 127 is taken from box 125 to return control to box 17. The effects on the configuration states which are neighbors of the goal (1,1) are illustrated in FIG. 7. The heap corresponding to FIG. 7 is illustrated at FIG. 8.

The above-described process of: exploring all of the neighbors of a first state; assigning appropriate costs and direction arrows to neighbors; and adding 'improved' neighboring states to the heap, is referred to herein as "budding" a state.

After budding the goal state (1,1), all neighbor states have been checked, so the 'yes' branch 128 is taken from box 17. The heap is not empty at box 14, as is illustrated in FIG. 8, so branch 15 is taken from box 14.

In box 16, the next top state is retrieved. This is the smallest cost item which is on top of the heap. The next top state has indices (0,1), 600 in FIG. 8.

The (0,1) state at the top of the heap is the next to be "budded". The neighbors in the directions $(\overline{-1,1}), (\overline{-1,0})$, and $(\overline{-1,-1})$ have an infinite transition cost since the walls are constraints. No impact can be made on any other neighbor of the (0,1) state, so no changes are made to the configuration space. For instance, when budding state (0,1), neighboring state (0,2) is considered. At this stage, the cost_to_goal field of (0,2) is already set to 1.4. The transition cost to state (0,2) is 1. The sum of the transition cost and the top state's (0,1)'s cost_to_goal is 2. The sum is thus greater than the neighbor's (0,2)'s preexisting cost_to_goal. Therefore branch 124 is not taken. No improvement can be made. Branch 129 is taken instead, returning control to box 17. Taking branch 129 is referred to herein as "not impacting" another state. The budding of (0,1) is complete. The heap now is as shown in FIG. 9.

The top state (1,0) from FIG. 9 is the next to be budded. Budding of this state does not result in any impact, nor does the budding of node (2,1) (the next to be budded after (1,0)). After consideration of state (2,1) the heap appears as shown in FIG. 10.

As state (0,2) is budded, an improvement can be made to both (0,3) and (1,3). They are then added to the heap, and their cost_to_goal and direction_arrows fields are updated. The configuration space and heap are now as shown in FIG. 11 and FIG. 12, respectively.

The new top state of the heap, (2,0) as seen in FIG. 12, is next to be budded. Budding of the state (2,0) does not make an impact on any neighbors. The next top of the heap is (0,0), which does not result in any impact either. Nor does (0,3). Once these 3 have been removed from the heap, only (2,2) and (1,3) remain.

Figures 13, 14, 15, 16:
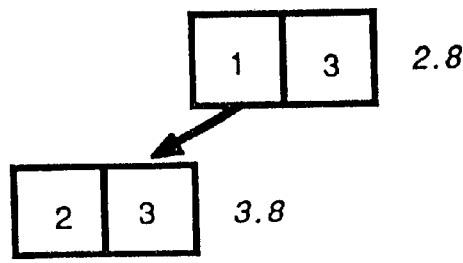

Budding of (2,2) results in improvement of the "uncosted" state (2,3) to its right, so we add the new cost and arrow to that neighbor, and add (2,3) to the heap. No impact can be made on any other neighbor. The results are illustrated in FIGS. 13 and 14.

State (1,3) is now budded. Evaluating the cost to the neighbor (2,3) below gives an equal cost_to_goal to what (2,3) already has. This is referred to herein as an "equivalent" path and corresponds to branch 123 in FIG. 1b. An "alternative arrow" is added to this neighbor (2,3), but (2,3) is not added to the heap.

It is noted that the direction_arrows field can contain more than one arrow as illustrated in 1504 of FIG. 2.

The last node in the heap to be budded is (2,3) the budding of which does not impact on any neighbors.

The heap is now empty. Therefore branch 130 is taken in FIG. 1b and budding is completed.

Once the budding of all the states of the configuration space is finished, a path can be followed from any starting position to the goal by simply following the direction_arrows values. The cost in each configuration state gives the total cost required to reach the goal from that state. If the user wanted to start at (2,3), 2 alternate routes exist. Both cost 3.8 (units of time). These routes are illustrated in FIGS. 15 and 16. In FIG. 15 the route starts at (2, 3) and proceeds to (1,3), (0,2), and finally to the goal state (1,1) in that order. In FIG. 16 the route goes over the sagging floor from (2,3) to (2,2) and then to the goal state (1,1). The series of set points sent to the robot would thus be (2,3), (1,3), (0,2), (1,1), or (2,3), (2,2), (1,1). Both will lead to arrival of the robot in 3.8 units of time.

It is important to notice that there are situations that occur where transformed obstacles may completely separate the start state from the goal state, e.g. if (0,2), (1,2) and (2,2) all were constrained by obstacles, forming a wall for instance. In this situation, when budding has completed, there will be no arrows at the starting state. This indicates that there is no path to the goal from this starting state. It is important to know if a path is possible at all, since effort might otherwise be wasted when there is no solution.

Appendix A contains source code implementing the method of FIGS. 1a and 1b.

D. Applying Budding to a Robot Arm Having Two Rotational Degrees of Freedom

1. Coarse Configuration Space

Figure 17:
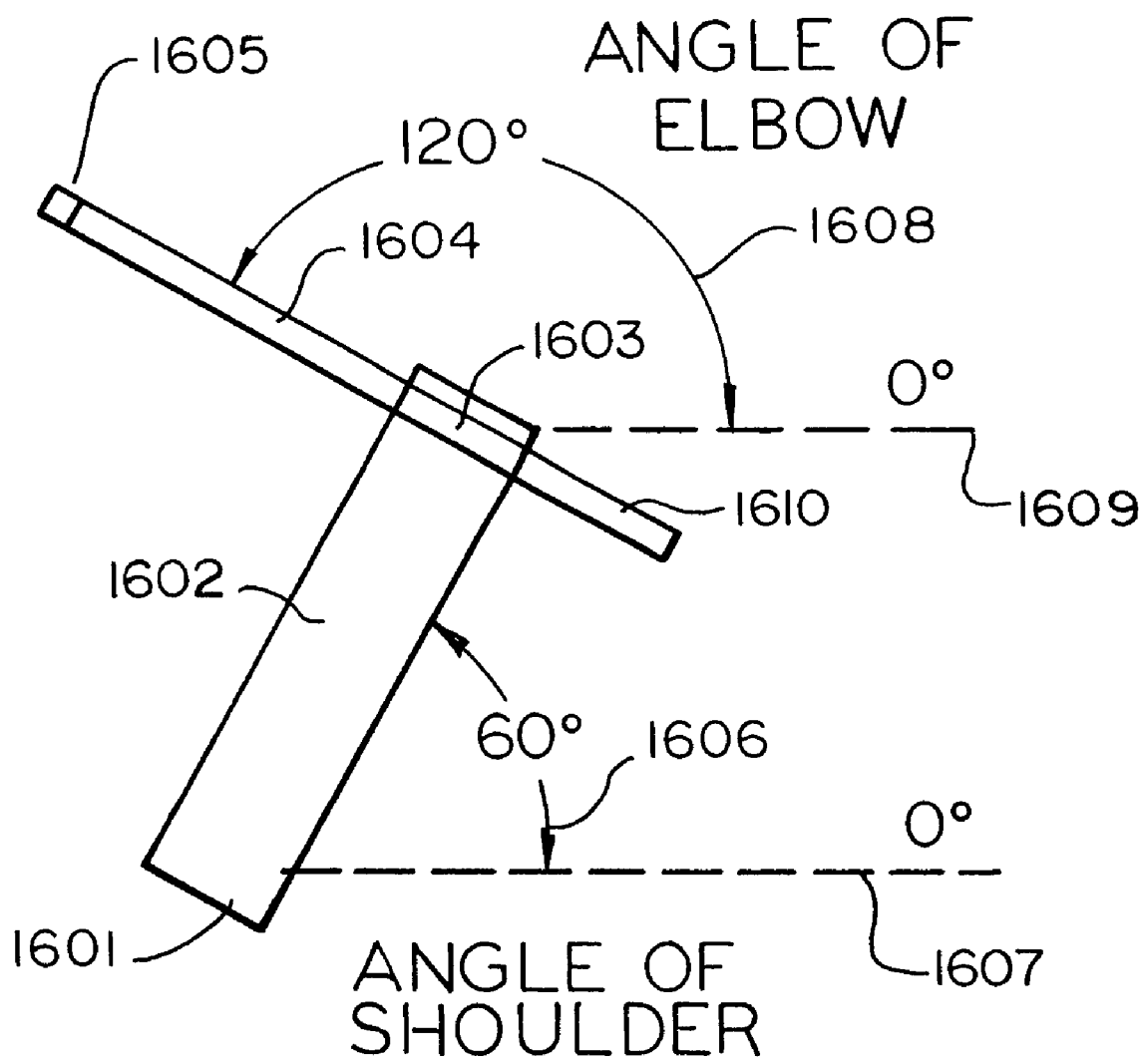
FIG. 17 is a schematic drawing of a two link robot.

FIG. 17 represents a two-link robot. The robot has a shoulder joint 1601, an upper arm 1602, an elbow joint 1603, a forearm 1604, a protruding part 1610 beyond the elbow joint 1603, and an end effector 1605. Because the two-link robot has two joints, the elbow joint 1603 and the shoulder joint 1601, the robot has two rotational degrees of freedom. FIG. 17 illustrates a convention for measuring the angles of rotation. The angle 1606 of the shoulder joint 1601 is 60°, measured from a horizontal axis 1607. The angle 1608 of the elbow 1603 is 120°, measured from a horizontal axis 1609.

Figure 20:
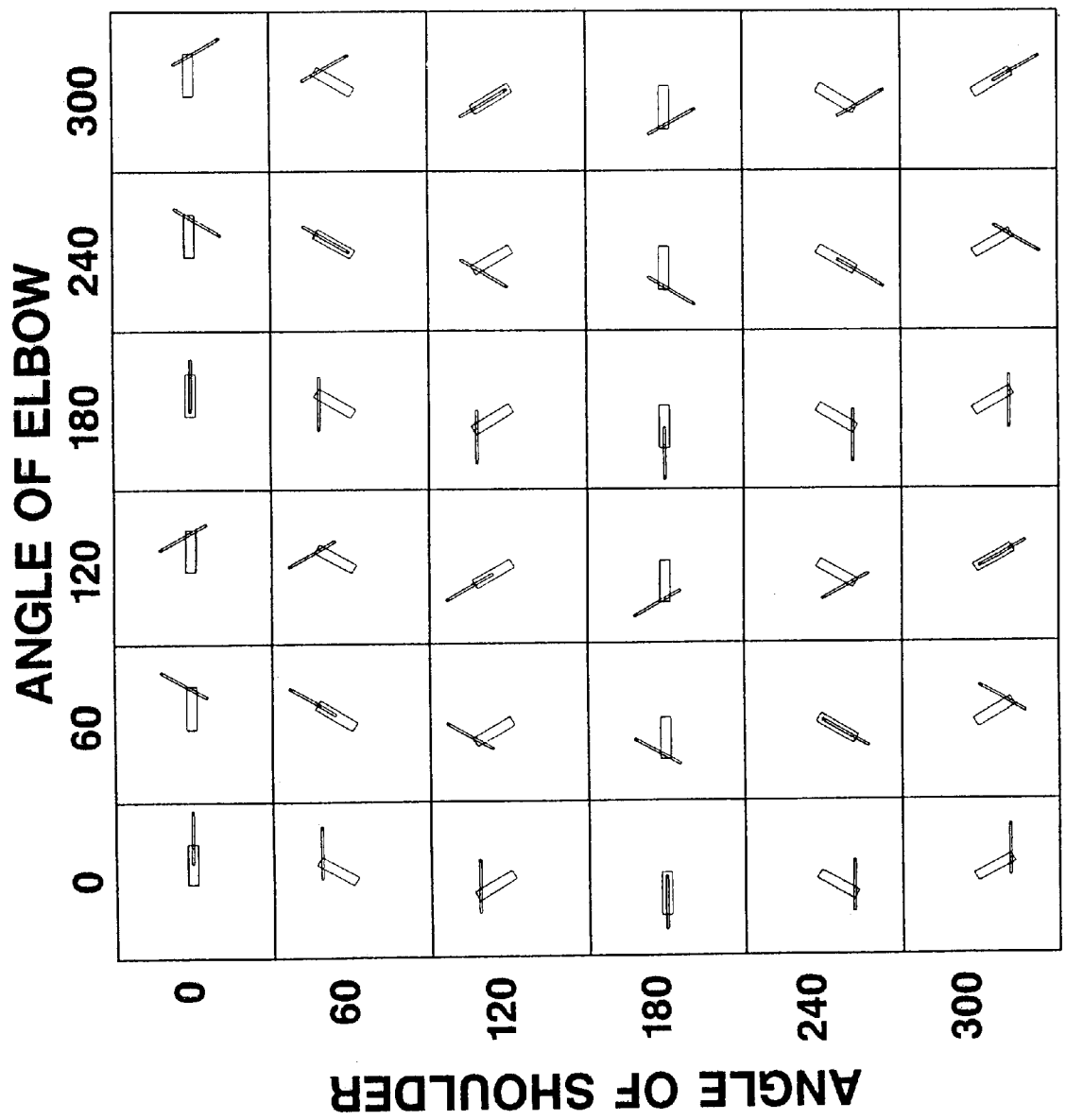
FIG. 20 shows a coarse configuration space for a 2-link robot with two rotational degrees of freedom.

FIG. 20 represents a coarse discrete configuration space for the robot of FIG. 17. This coarse configuration space is presented as a simplified example. In practice, one skilled in the art would generally use a finer configuration space to allow for finer specification of the motion of the corresponding robot arm. The first degree of freedom in FIG. 20 is the angle of the shoulder joint of the robot arm. This first degree of freedom is plotted along the vertical axis of FIG. 20. The second degree of freedom is the angle of elbow of the robot arm and is plotted along the horizontal axis. The discretization of the angles is in multiples of 60°.

The position of the robot which corresponds to each state of the configuration space is illustrated with in the appropriate box in FIG. 20. Thus the state (0°,0°) corresponds to the position in which the arm is completely extended horizontally, with both the shoulder and the elbow at 0°. The fat part of the arm, e.g. 2001 is the upper arm, between the shoulder and the elbow. The thin part of the arm, e.g. 2002, is the forearm, between the elbow and the end effector.

As in FIG. 2, each state of the configuration space of FIG. 20 has a cost_to_goal and a direction_arrows field. These fields are not shown again in FIG. 20.

2. Finding Obstacle Regions in Fine Configuration Space

Figure 21:
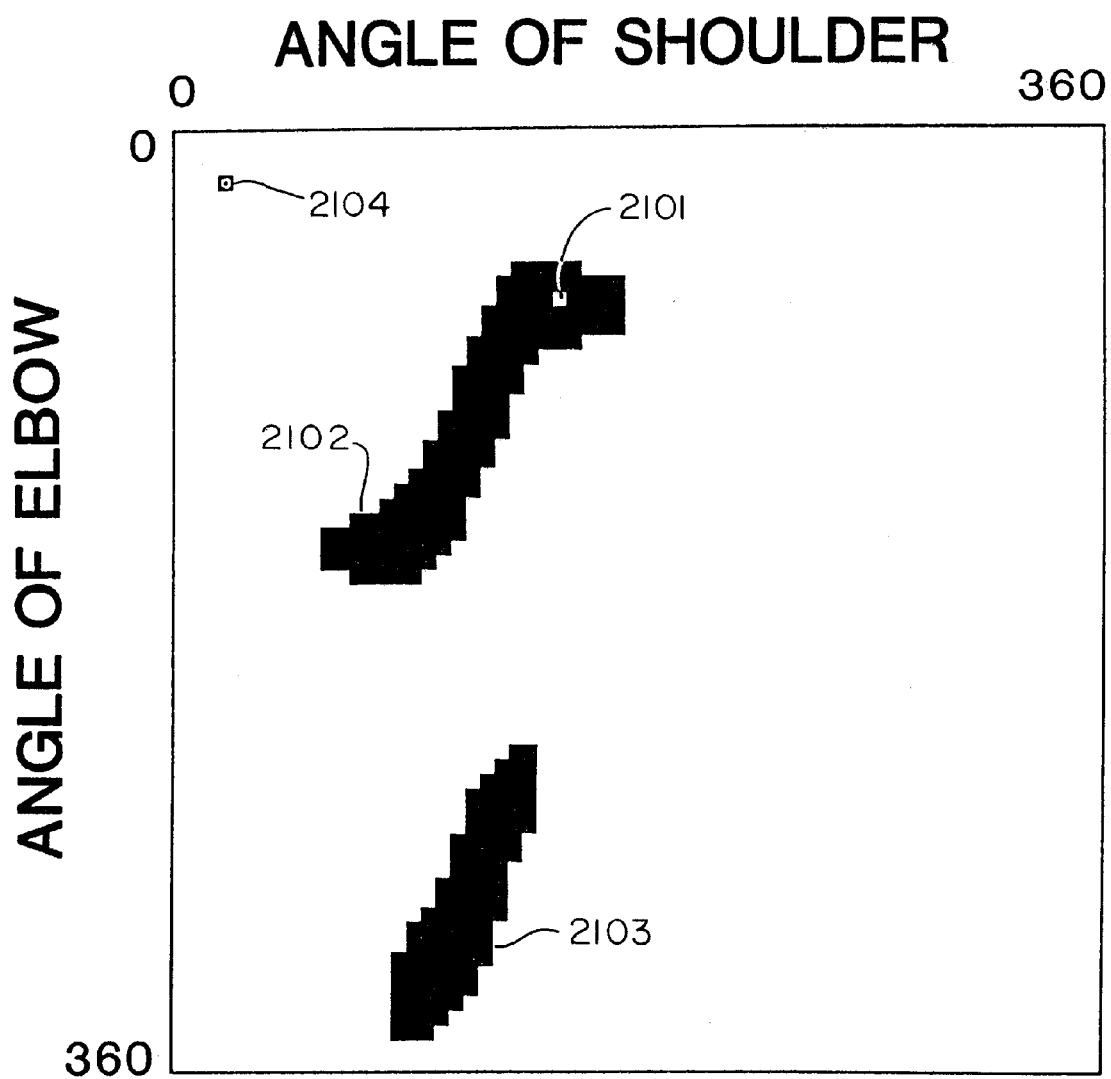
FIGS. 21, 24, 26, 28, 29, 30, 33, 34, 35 and 38 show configuration spaces for the robot with two rotational degrees of freedom.

FIG. 21 is a fine-grained configuration space for a two-joint robot arm. The fine-grained configuration space is a 64×64 array. The individual states of the fine-grained configuration space are not demarcated with separator lines, unlike FIG. 20, because the scale of the figure is too small to permit such separator lines. In the configuration space of FIG. 21, unlike the configuration space of FIG. 20, the vertical axis is the angle of the elbow. The angle of the elbow increases from top to bottom from 0° to 360°. The horizontal axis is the angle of the shoulder. The angle of the shoulder increases from left to right from 0° to 360°. In the coarse space of FIG. 20, the axes were marked off in units of 60°. However, in the fine space of FIG. 21, the axes are divided into units of 360°/64, or approximately 5.6°.

Figure 22:
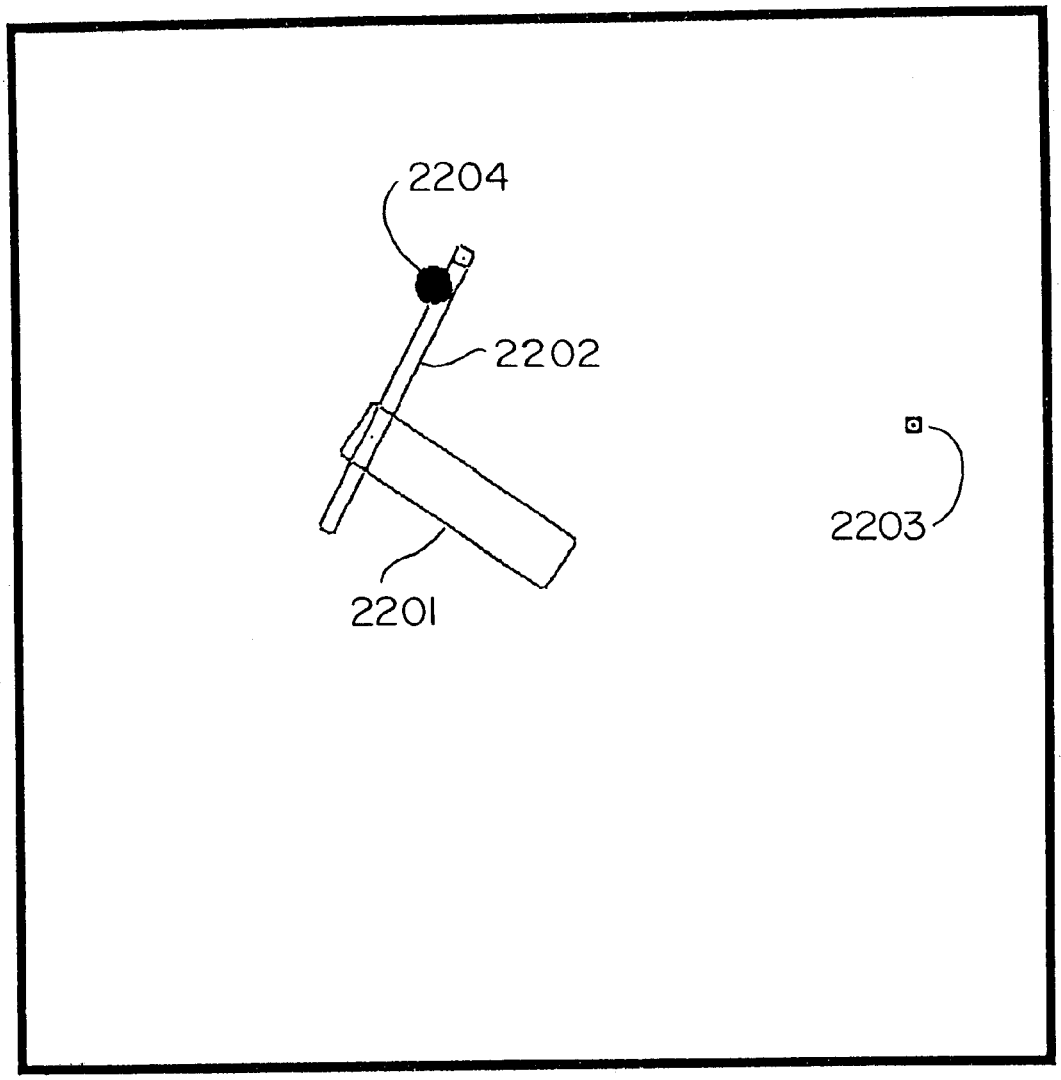
FIGS. 22, 23, 25, 27, 31, 32, 36, 37 and 39 show task spaces for the robot with two rotational degrees of freedom.

FIG. 22 is a task space which corresponds to the configuration space of FIG. 21. In FIG. 22 the upper arm of the two-link robot is at 2201. The forearm is at 2202. A goal is shown at 2203. An obstacle is shown at 2204. The robot is shown in a position which it in fact cannot assume, that is overlapping an obstacle. This position has been chosen to illustrate a point in the configuration spaces The white state 2101 of the configuration space in FIG. 21 corresponds to the position of the robot in the task space of FIG. 22. The white state 2101 is located in a black region 2102 which is a representation of the obstacle 2204. There is a second black region 2103 which also represents the obstacle. The black areas represent all of the configurations in which the robot will overlap the obstacle. The goal appears at 2104.

It is noted that there are two obstacle regions 2102 and 2103 in FIG. 21. This results because some states correspond to the forearm end 1604 hitting the obstacle and some states correspond to the protruding part 1610 hitting the object.

One skilled in the art might devise a number of ways of determining which regions in configuration space correspond to an obstacle in task space. One simple way of making this determination, is to simulate each state of the configuration space one by one in task space and test whether each state corresponds to the robot hitting the obstacle. Standard solid-modelling algorithms may be used to determine whether the robot hits the obstacle in task space. One such set of algorithms is implemented by representing surfaces using the B-rep technique in the Silma package sold by SILMA, 211 Grant Road, Los Altos, Calif. 94022. In the task space of FIG. 22 the forearm 2202 hits the obstacle 2204, which corresponds to the white state 2101 of the configuration space. The white state 2101 therefore becomes part of the obstacle region.

Figure 23:
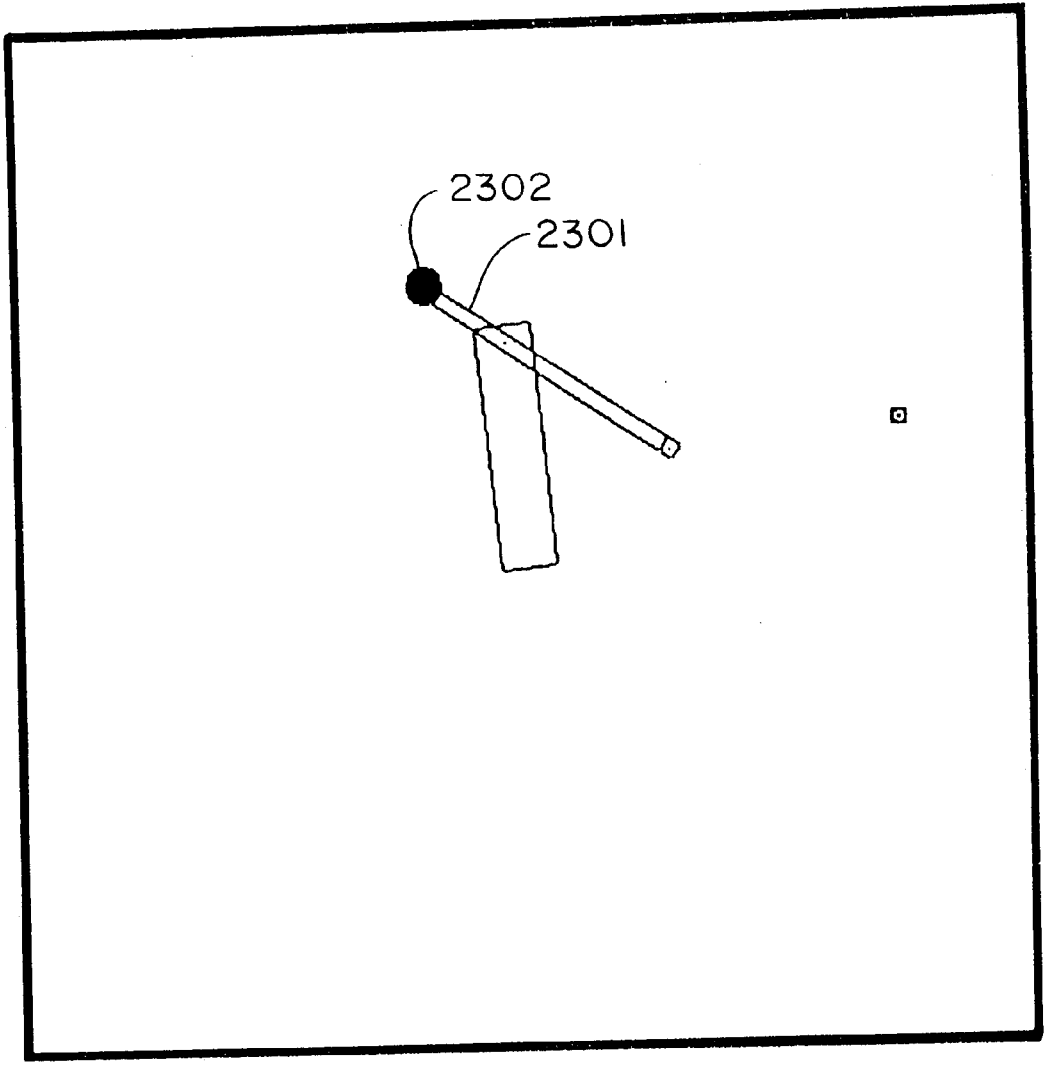
Figure 24:
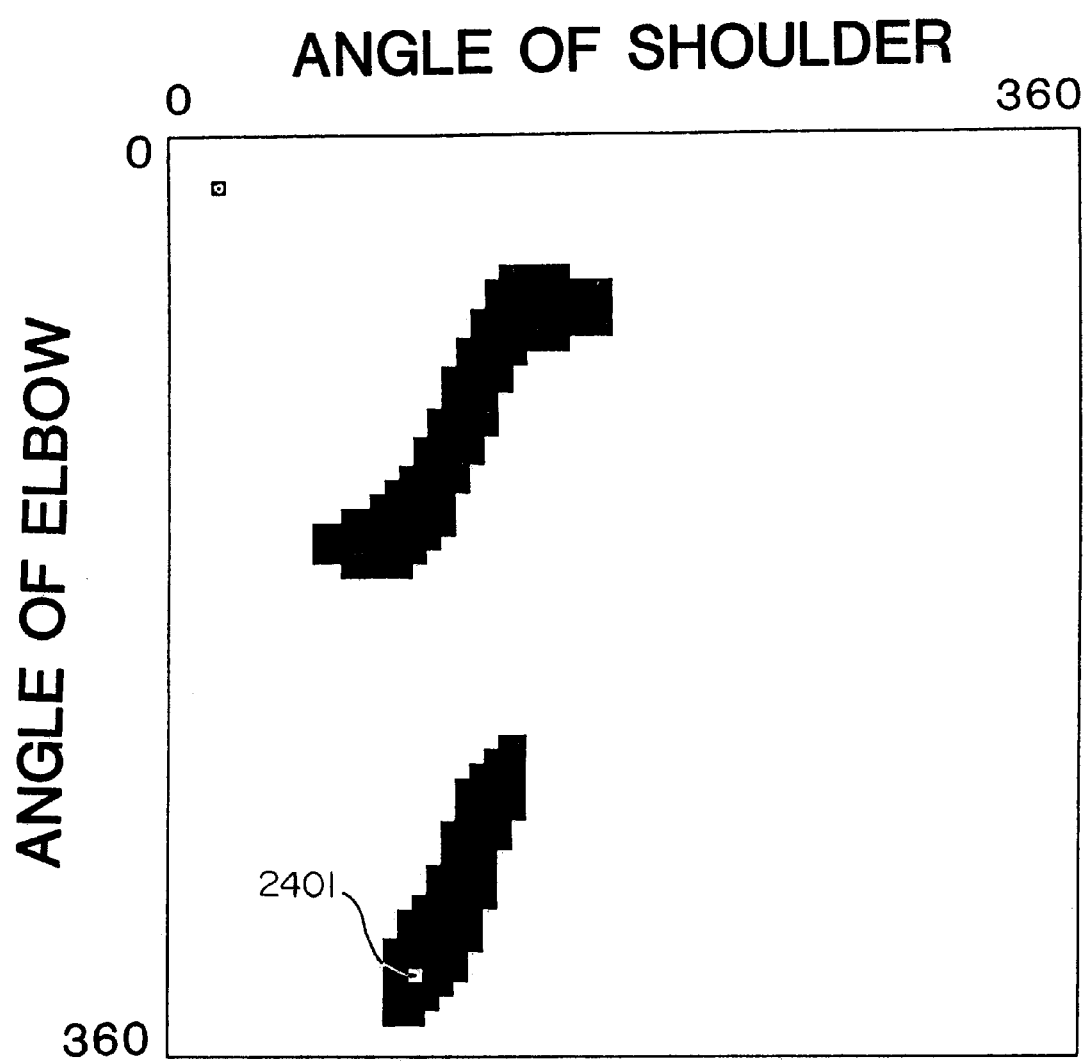

FIGS. 23 and 24 illustrate the determination of an additional state in the obstacle region of the configuration space. In the task space of FIG. 23 the elbow 2301 hits the obstacle 2302. This position of the robot corresponds to the white state 2401 in FIG. 24.

Figure 25:
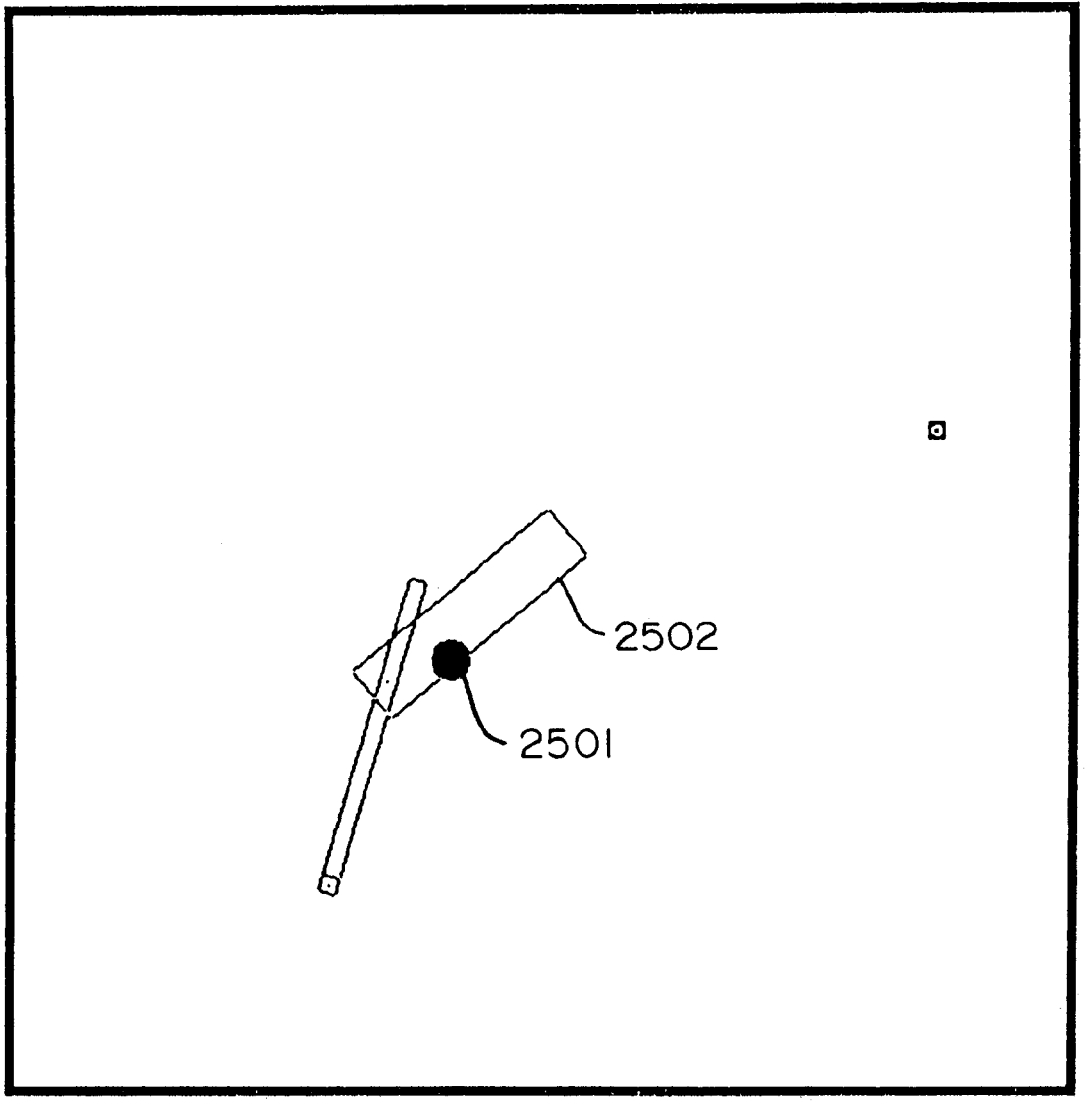
Figure 26:
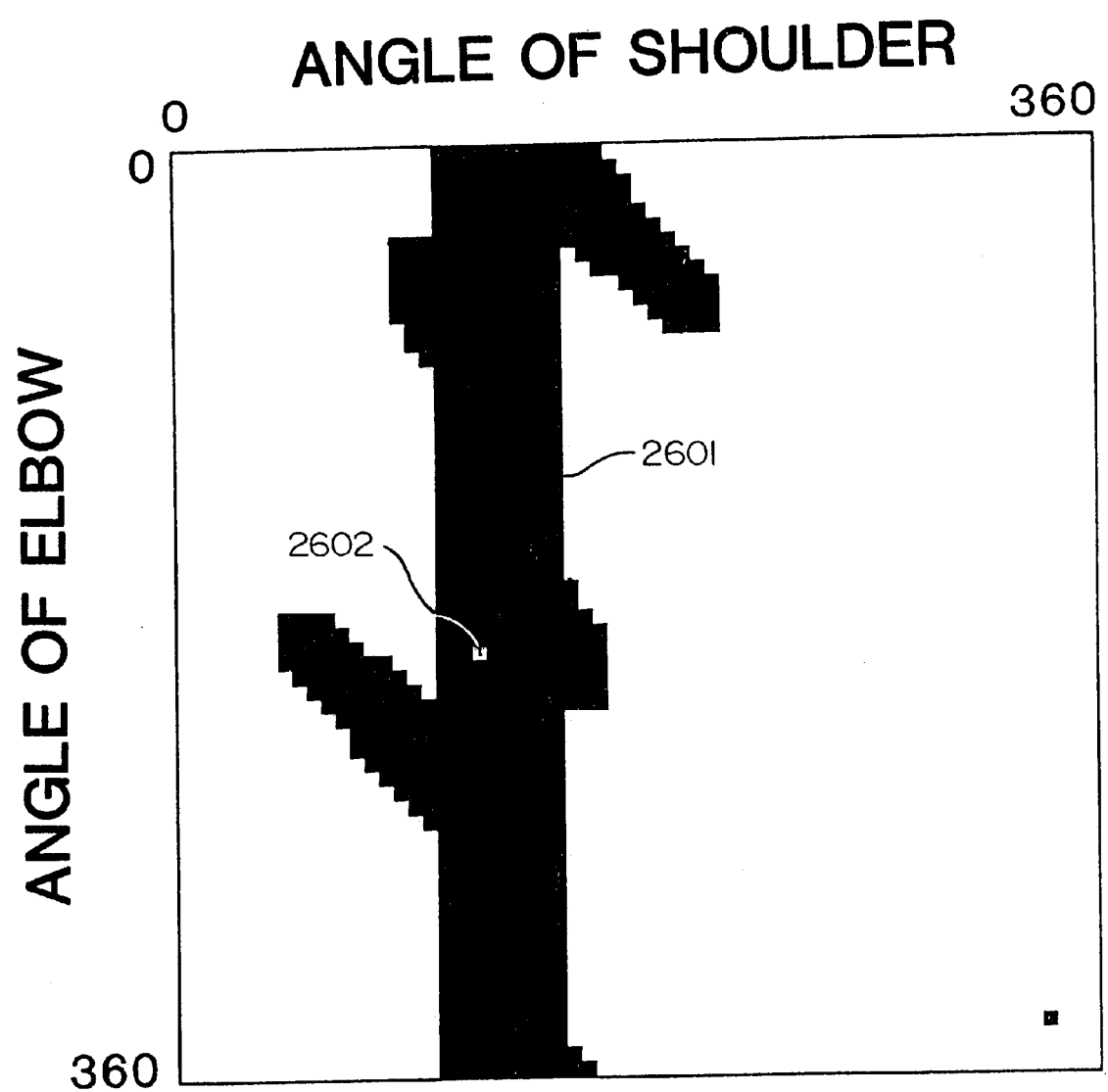

In the task space of FIG. 25, the obstacle 2501 has been moved. Now the upper arm 2502 of the robot hits the obstacle. In the task space of FIG. 25, all elbow angles for which the shoulder 2502 of the robot hits the obstacle 2501 are obstacle states because these states correspond to some part of the robot hitting an obstacle. This range of angles appears as a solid vertical bar in the obstacle region 2601 of the configuration space of FIG. 26. The bar appears because for the angles of the shoulder joint where the obstacle-hit occurs, any value of the elbow joint angle would lead to a collision. The particular position of the robot in the task space of FIG. 25 is illustrated as the state located at the white state 2602.

Once the states which hit the obstacle are identified, the states should be assigned a cost_to_goal of INF as indicated in box 12 of FIG. 1b. In FIG. 21 and what follows, assigning a cost_to_goal of INF will be represented by making the region of states corresponding to the obstacle black in the configuration space.

3. Budding Using a Simple Metric in Fine Configuration Space

Figure 29:
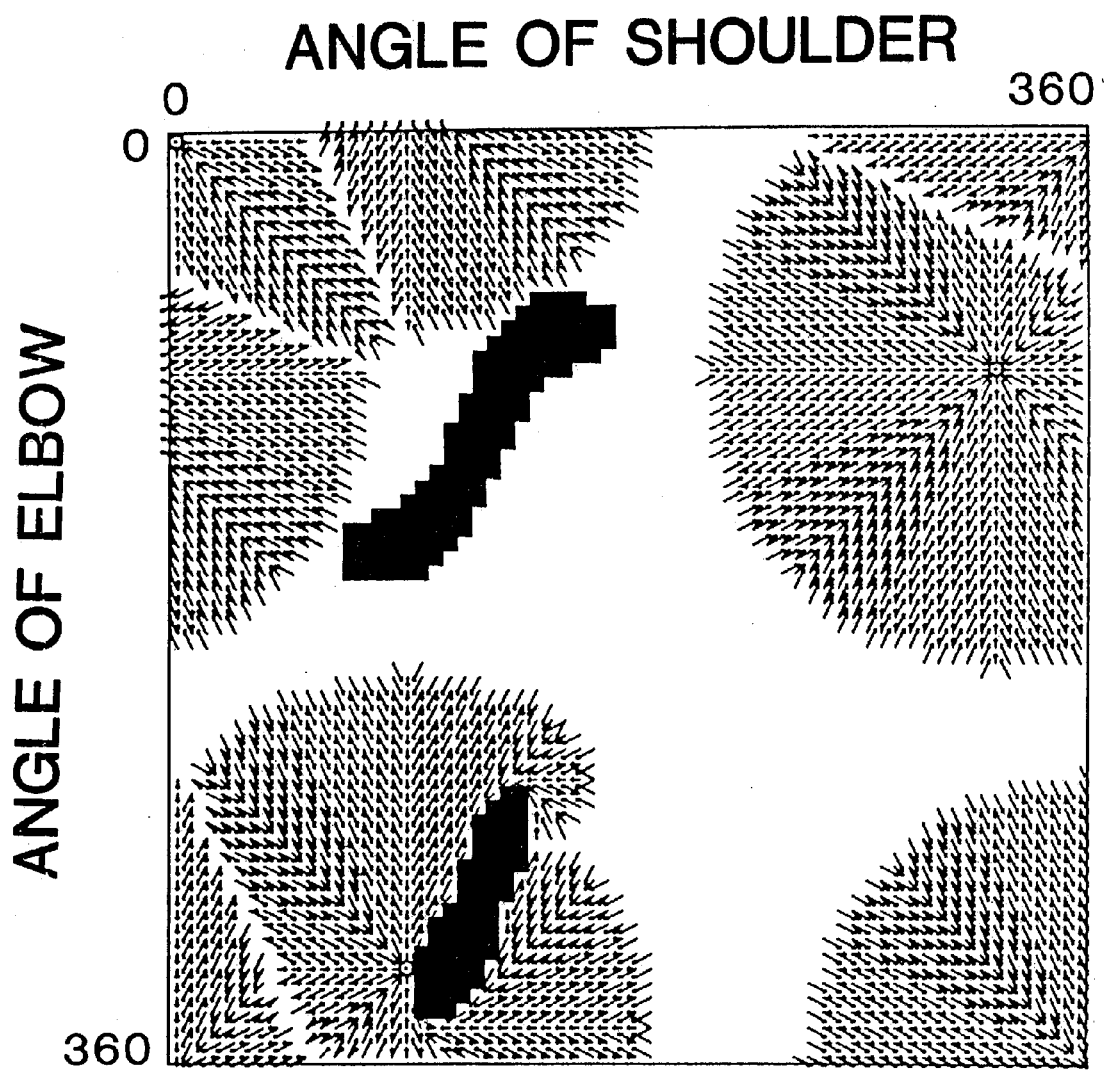
Figure 30:
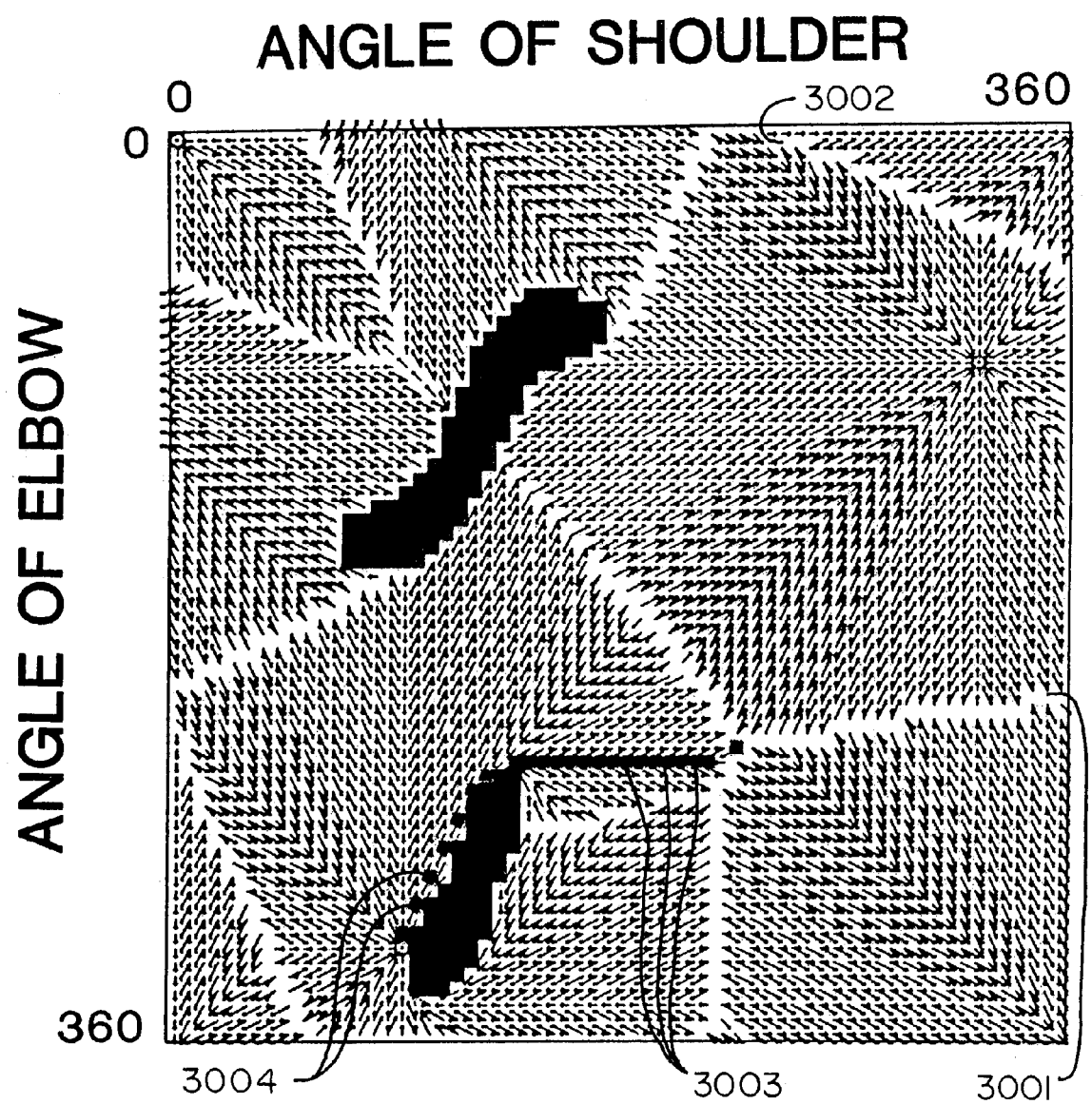

For simplicity, all of the steps of budding in FIG. 1b will not be gone through in detail with respect to the fine-grained two-dimensional configuration space. However, FIGS. 28, 29, and 30 illustrate various stages in the process of budding for such a space, once the obstacle regions and goal states have been located.

For a fine-grained configuration space, a metric data structure such as is illustrated in FIG. 19 may become awkward. A function can be used in place of the data structure. For instance the cost of a transition $(\overline{di,dj})$ at a location (i,j) can be $C(i,j,di,dj)$=INF if the state $(i+di,jdj)$ is an obstacle
    =$\sqrt{\sqrt{di*di+dj*dj}}$ elsewhere        (Eq. 1)

Figure 27:
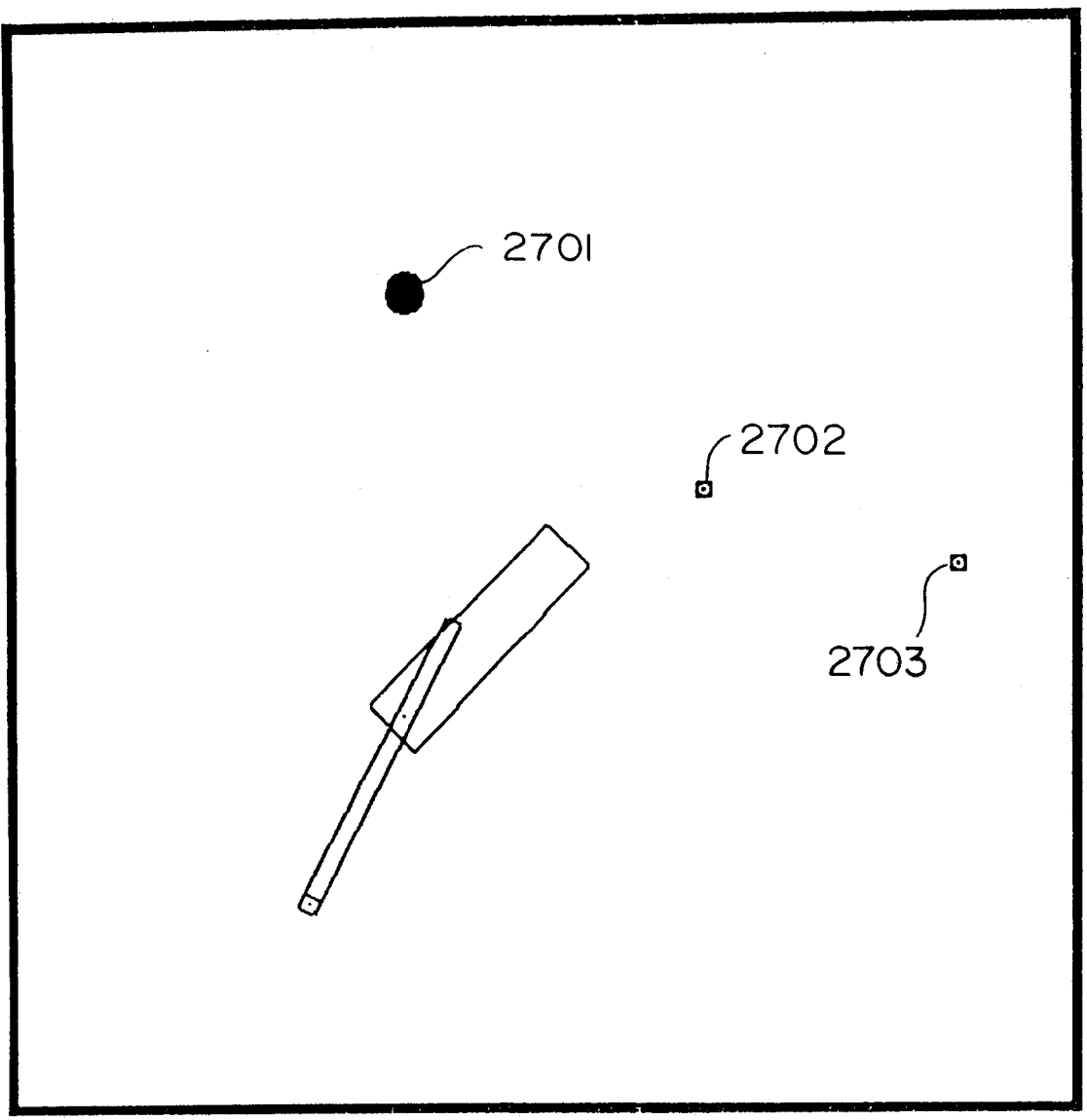

In the task space of FIG. 27, there is one obstacle 2701. There are two goals 2702 and 2703. The presence of two goals indicates, for instance, that the robot can perform an assigned task equally well at either goal. Therefore the robot should attempt to reach that goal which is the least expensive to reach.

Figure 28:
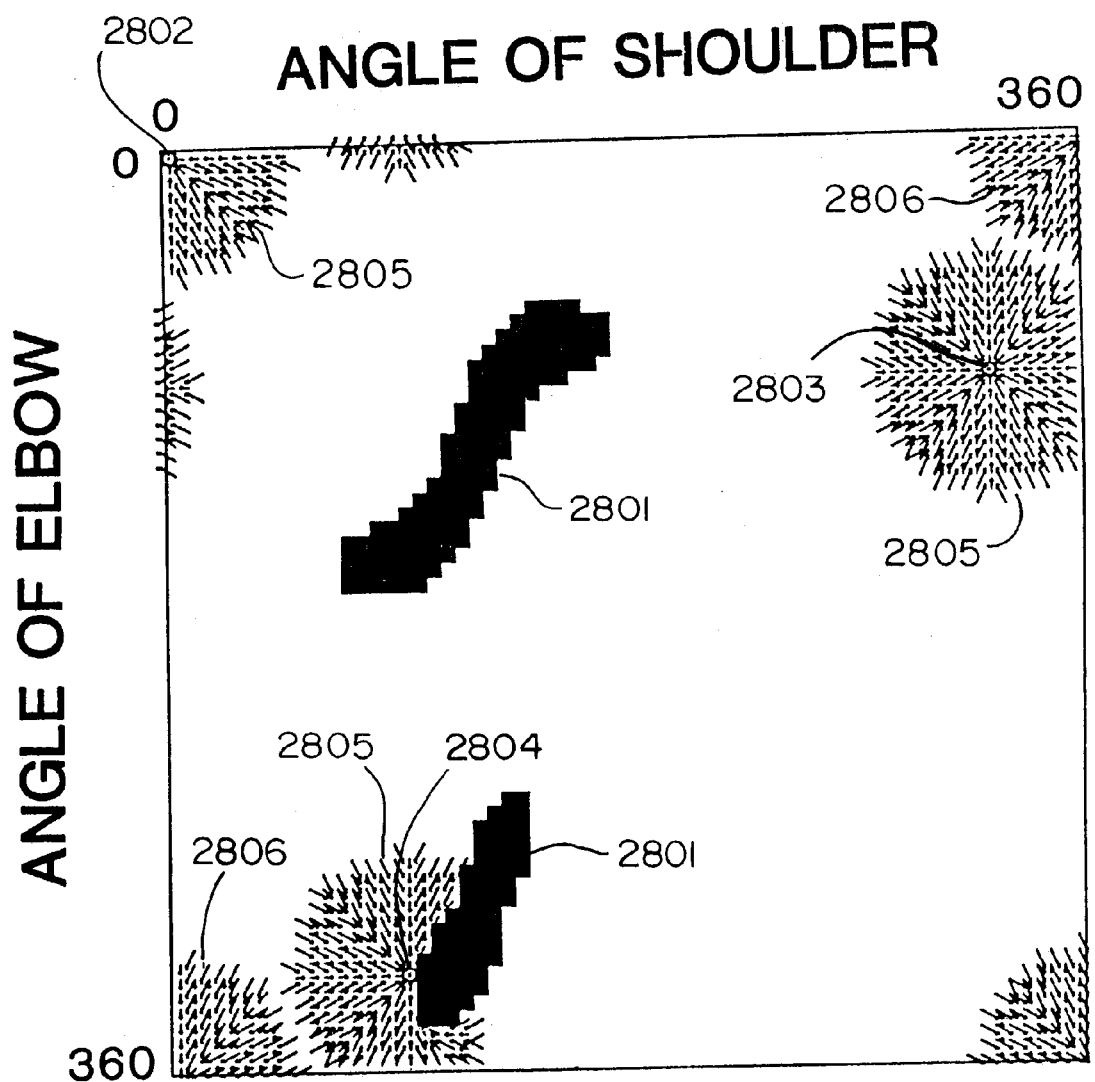

The configuration space of FIG. 28 corresponds to the task space of FIG. 27. The obstacle regions 2801 correspond to the obstacle 2701. The goal 2703 corresponds to the state at 2802. The states at 2803 and 2804 both correspond to the goal 2702. This occurs because the robot arm can take two positions and still have the end effector at the same point. In one of these two positions, the robot looks like a right arm and in the other position the robot looks like a left arm. In FIG. 28, the process of budding around the goal states has begun. A number of direction arrows, e.g. at 2805, appear. It is to be noted that the configuration space of FIG. 28 corresponds to two rotational degrees of freedom and is therefore periodic so that the picture will 'wrap-around' both horizontally and vertically. This manifests itself in that the configuration space of FIG. 28 is topologically equivalent to a torus. Therefore direction arrows, e.g. at 2806, which point to goal state 2802 appear instead to point to the boundaries of the configuration state. In fact, it is perfectly possible for a path of the robot to wrap around the configuration space.

In the configuration space of FIG. 29, the process of budding around the goal states has continued. It can now be seen that, with budding, the direction arrows propagate out from the goal states, but they point to the goal states. States with equal cost_to_goal are located on what appear to be equal cost wavefronts flowing out from the goal. For this reason, in the art the term "propagating cost waves" has been used to describe the process of assigning direction arrows to states in configuration space. It is noted that the prior art did not use budding to propagate cost waves, but instead produced a cost field by scanning the configuration space from top to bottom and then from bottom to top until the states stabilized.

The configuration space of FIG. 30 shows how the direction_arrows look when budding has been completed. There are a number of blank spaces, e.g. 3001, 3002, where there appear to be no direction_arrows. In fact these are states with direction_arrows pointing in more than one direction. In other words, these are states which have more than one path of equivalent cost to the goal state.

Figure 31:
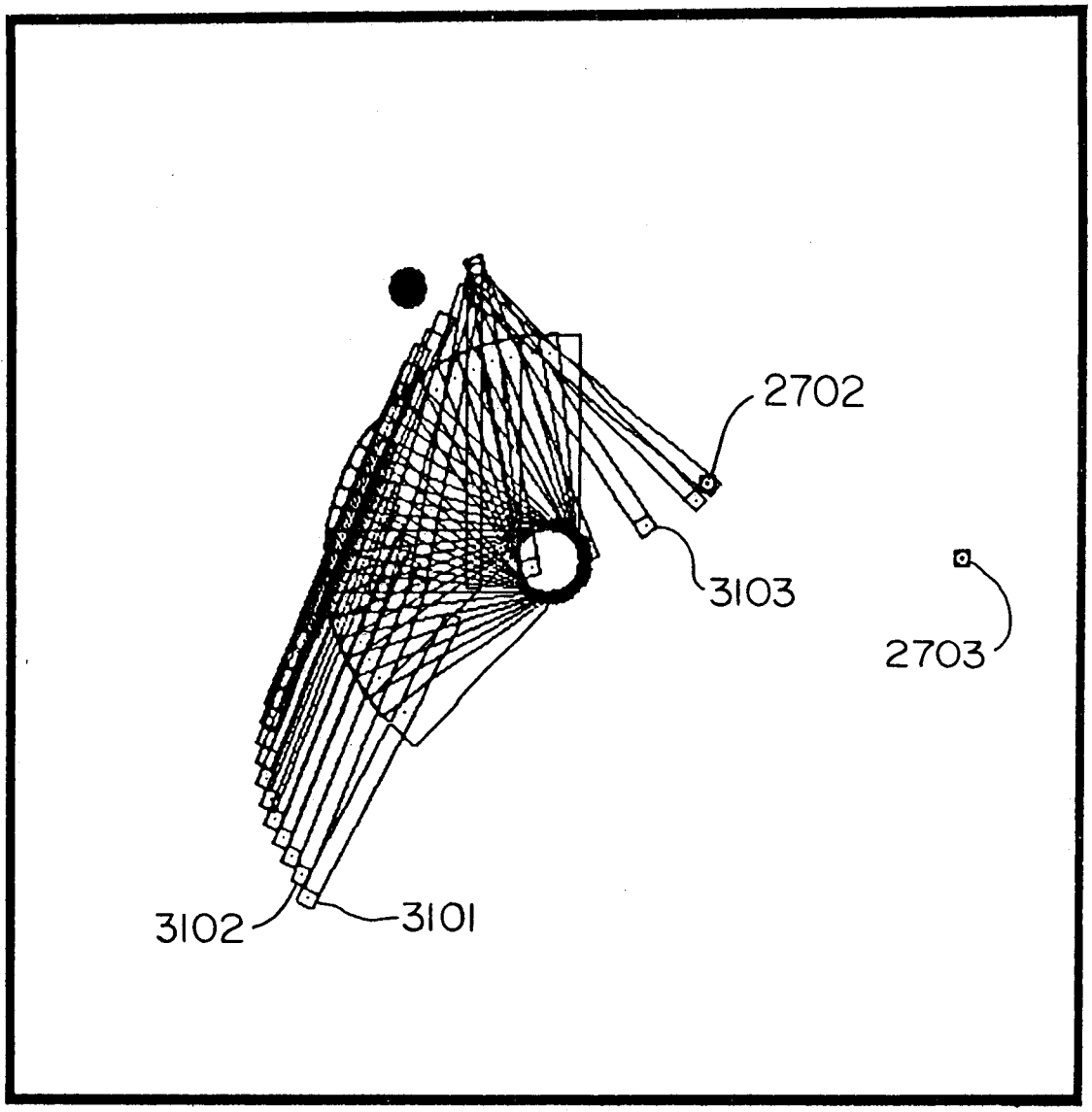

FIG. 31 is the same as the task space of FIG. 27, except that the motion of the robot along a path from starting point 3101 to goal 2702 is shown. The motion is shown by the superposition of a number of images of the robot in various intermediate positions, e.g. 3102 and 3103, along the path. The path also appears on the configuration space of FIG. 30. The path appears as shaded dots, e.g. 3003 and 3004, which are not part of the obstacle region.

4. Other Metrics

The metric of Eq. (1) is a locally "Euclidean metric", because it allocates transition costs to the neighbor states equal to their Euclidean distance in configuration space. As a consequence, the path in configuration space in the absence of obstacle regions is an approximation of a straight line. The approximation is better if more directions are available as direction arrows. The accuracy of the approximation using the 8 direction arrows corresponding to the horizontal, vertical and diagonal transitions is about 5% maximum error, 3%, average error. The accuracy of the approximation also using the knight's moves is about 1%. We will call the shortest paths produced by using a Euclidean metric in configuration space "minimum motion" paths.

In some applications, one may be interested in paths that are optimal in the sense that they minimize the distance travelled by the end effector. We will call this "minimum distance" paths. For example, if something is gripped that should not be moved too much, minimum distance paths are the paths sought. These minimum distance paths can also be found by the method described. The only difference in the procedure is that a different background metric is used. The transition cost c(i,j,di,dj) in a state (i,j) for direction arrow ($\overline{di,dj}$) is now:

$$c(i, j, di, dj) = (di)^2 + (dj)^2 + 2\cos 2\pi \left(\frac{i}{N} - \frac{j}{M}\right) \cdot di \cdot dj \quad \text{Eq. (2)}$$

where N is the number of states along the i-axis, and M is the number of states along the j-axis. This is the distance travelled by the end effector. As an example of the use of this metric, consider the task space of FIG. 32. A goal 32001 is indicated, as are obstacles 32002 and the robot in the start configuration 32003. FIG. 33 shows the corresponding configuration space. The goal 32001 in task space transforms to two goals 33001 in configuration space, each corresponding to one of the two ways in which the end effector can touch the goal point in task space. The obstacles in task space transform to obstacle regions in configuration space. These are indicated in black.

Figure 33:
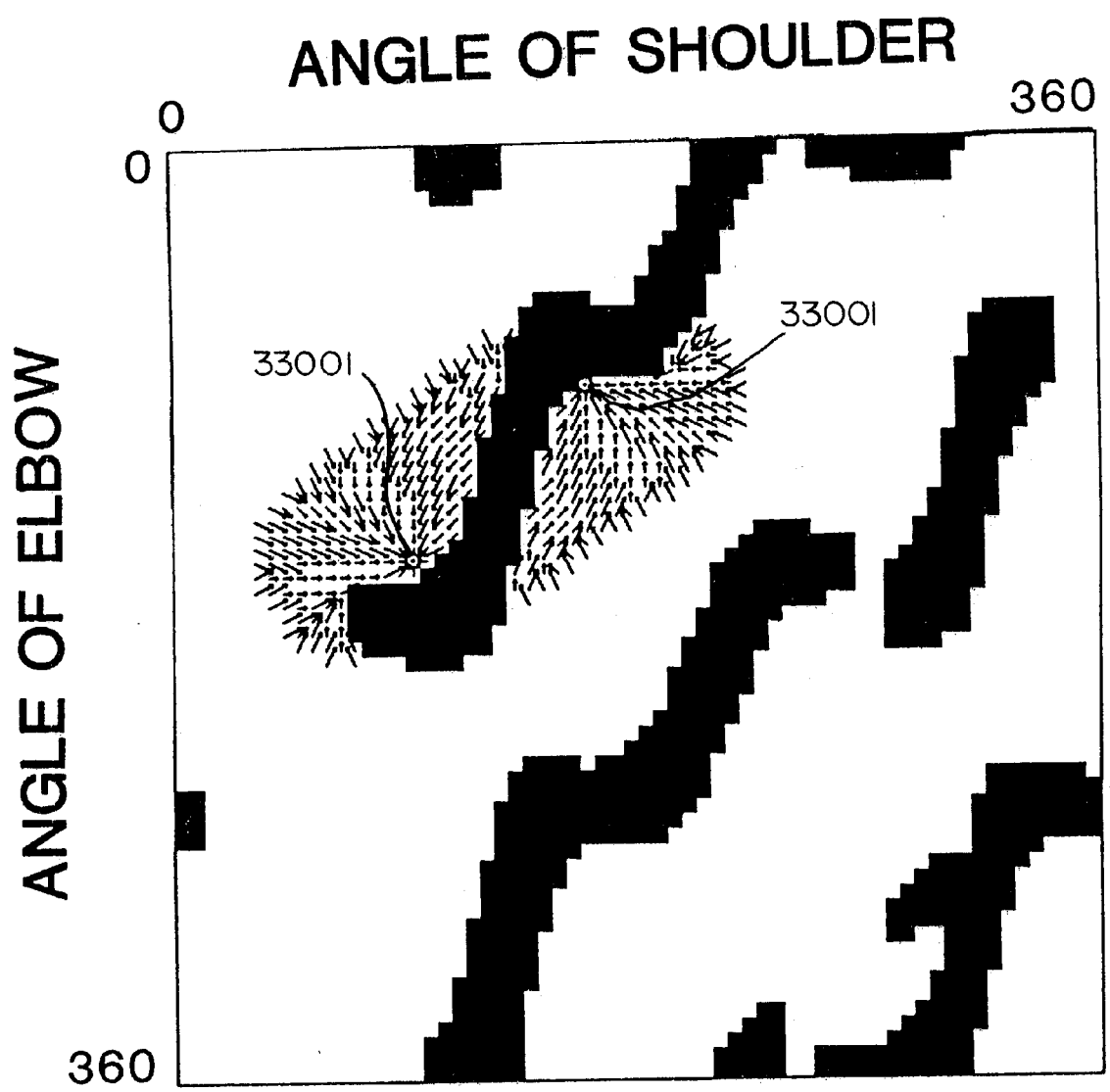
Figure 34:
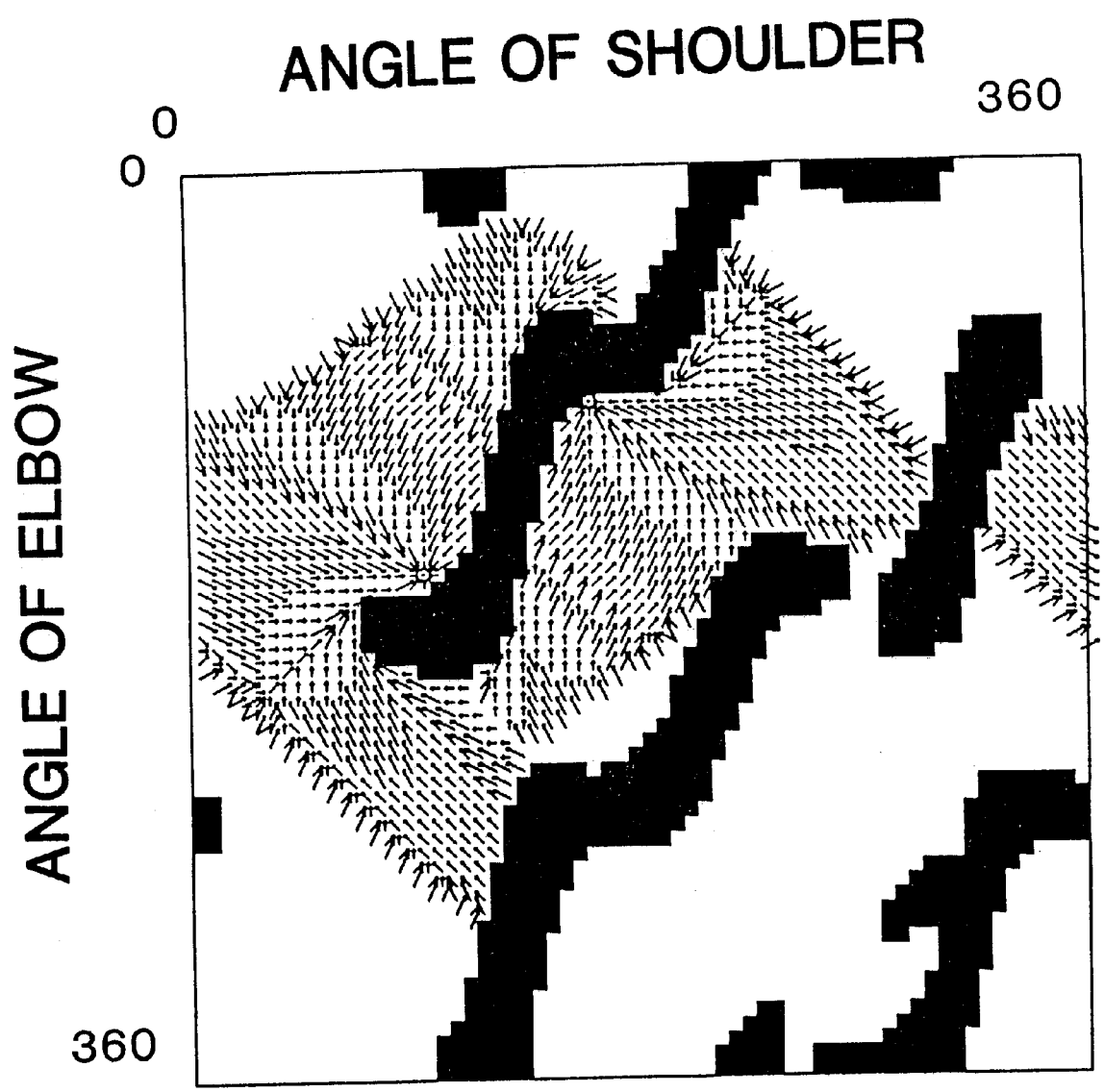
Figure 35:
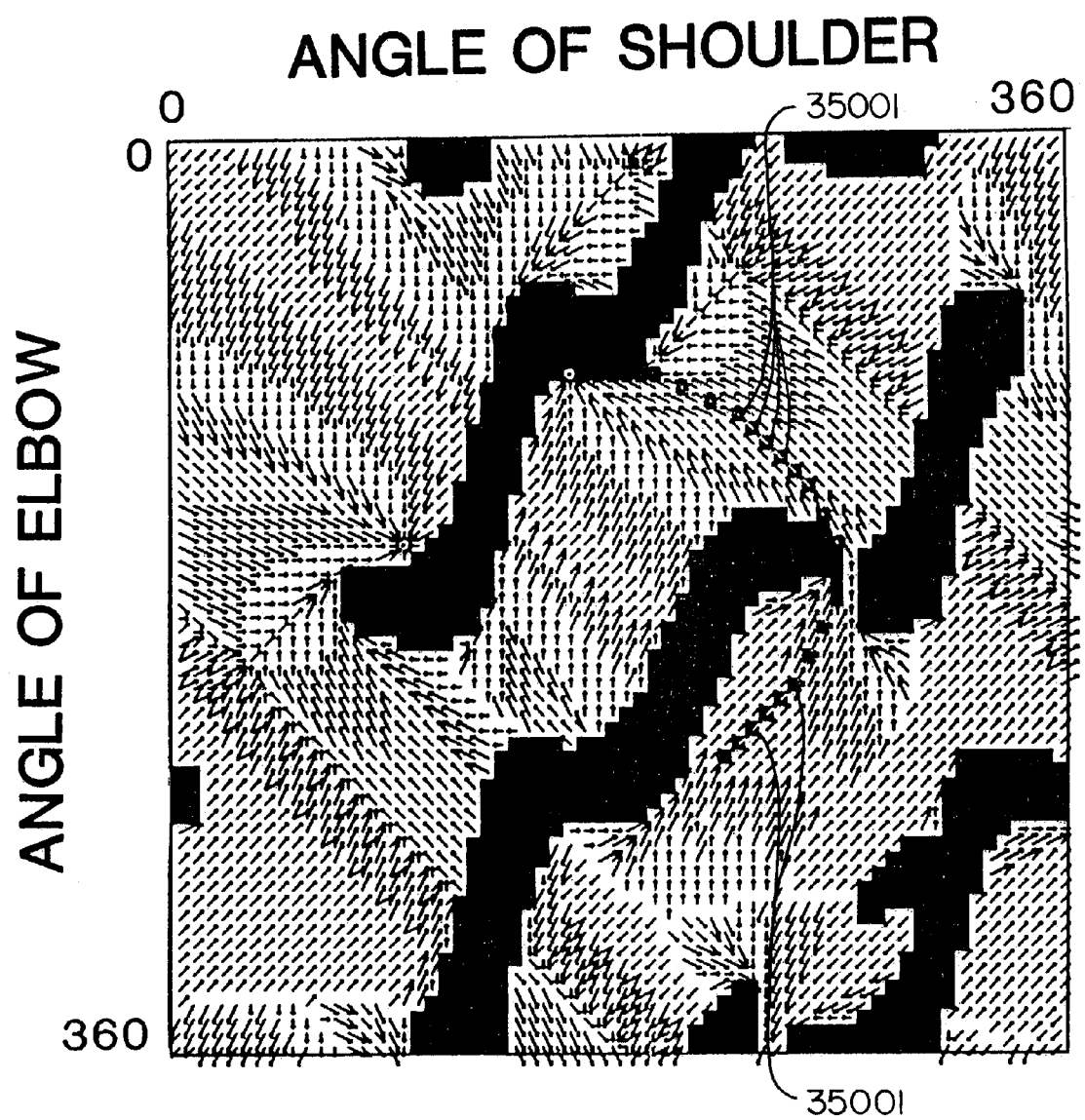
Figure 36:
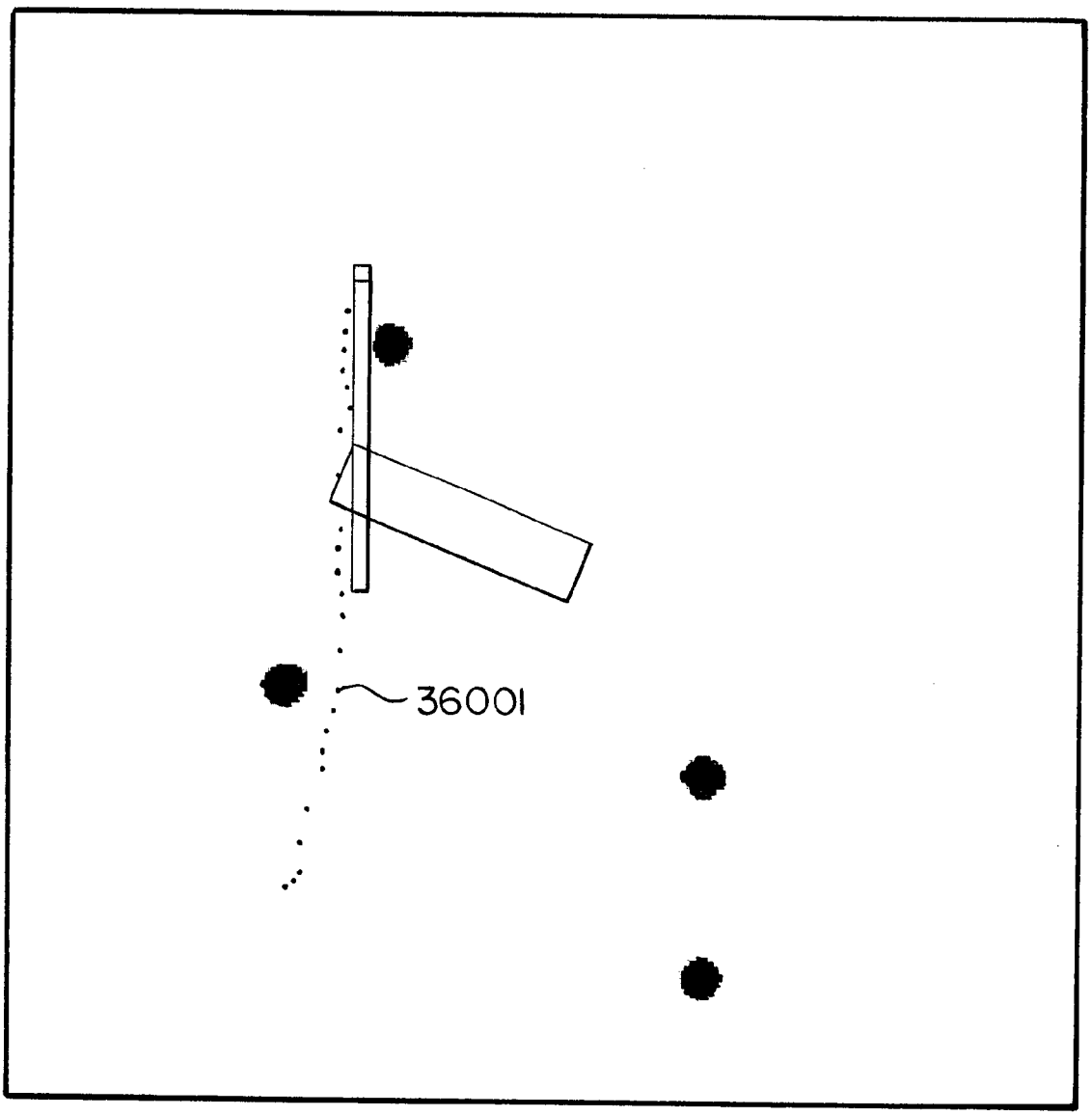
Figure 37:
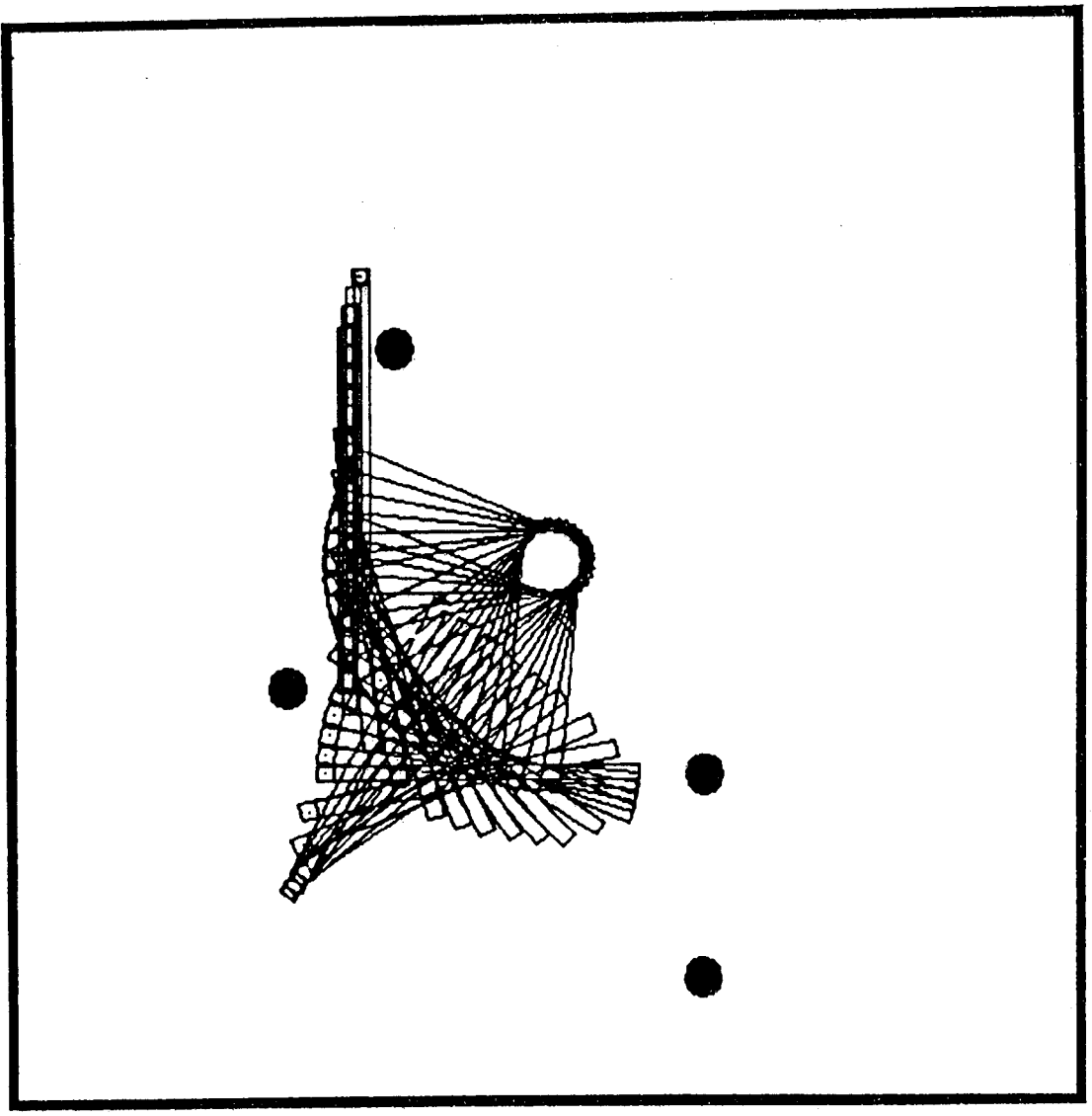

Budding proceeds as before, using the metric of Eq.(2). FIG. 33 and FIG. 34 show two intermediate stages in budding. FIG. 35 shows the final result. The path found in configuration space is indicated by shaded states 35001. Note that the path is a curve in configuration space. FIG. 36 shows the path 36001 of the end effector in task space, and the goal pose reached. Note that 36001 is almost a straight path. The smaller deviations from a straight path are due to the resolution in configuration space and obstacle avoidance. With angle increments of 5.6 degrees one cannot produce points along perfect straight lines. The larger deviations from a straight path are due to the fact that the robot should not only produce the shortest path for the end effector, but also avoid the obstacles. This effect is seen in FIG. 37, which shows all intermediate states of the robot as it moves from start to goal. This simultaneous optimization of collison-free paths with a minimization criterion is an important feature of the method.

Figure 32:
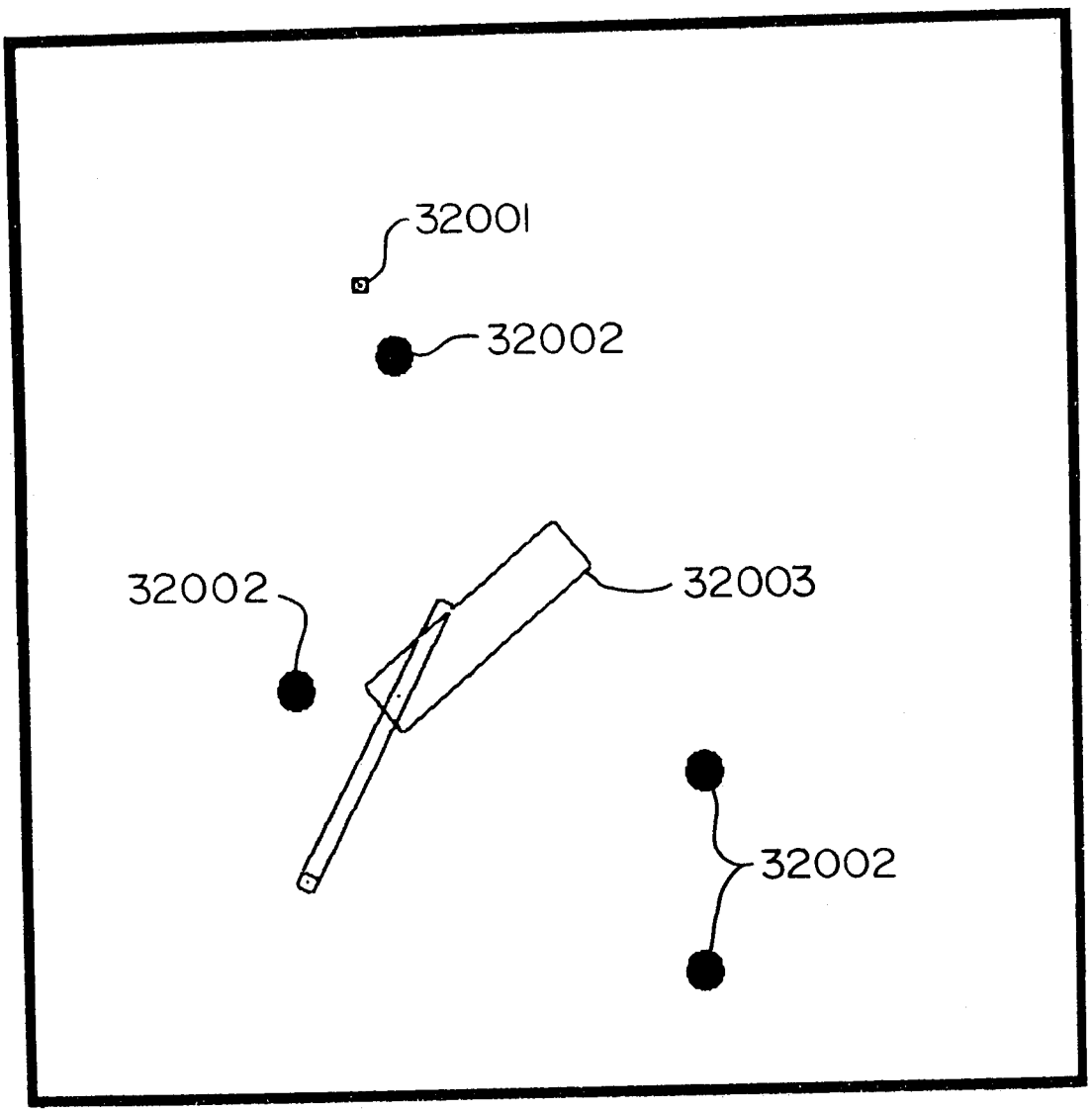
Figure 38:
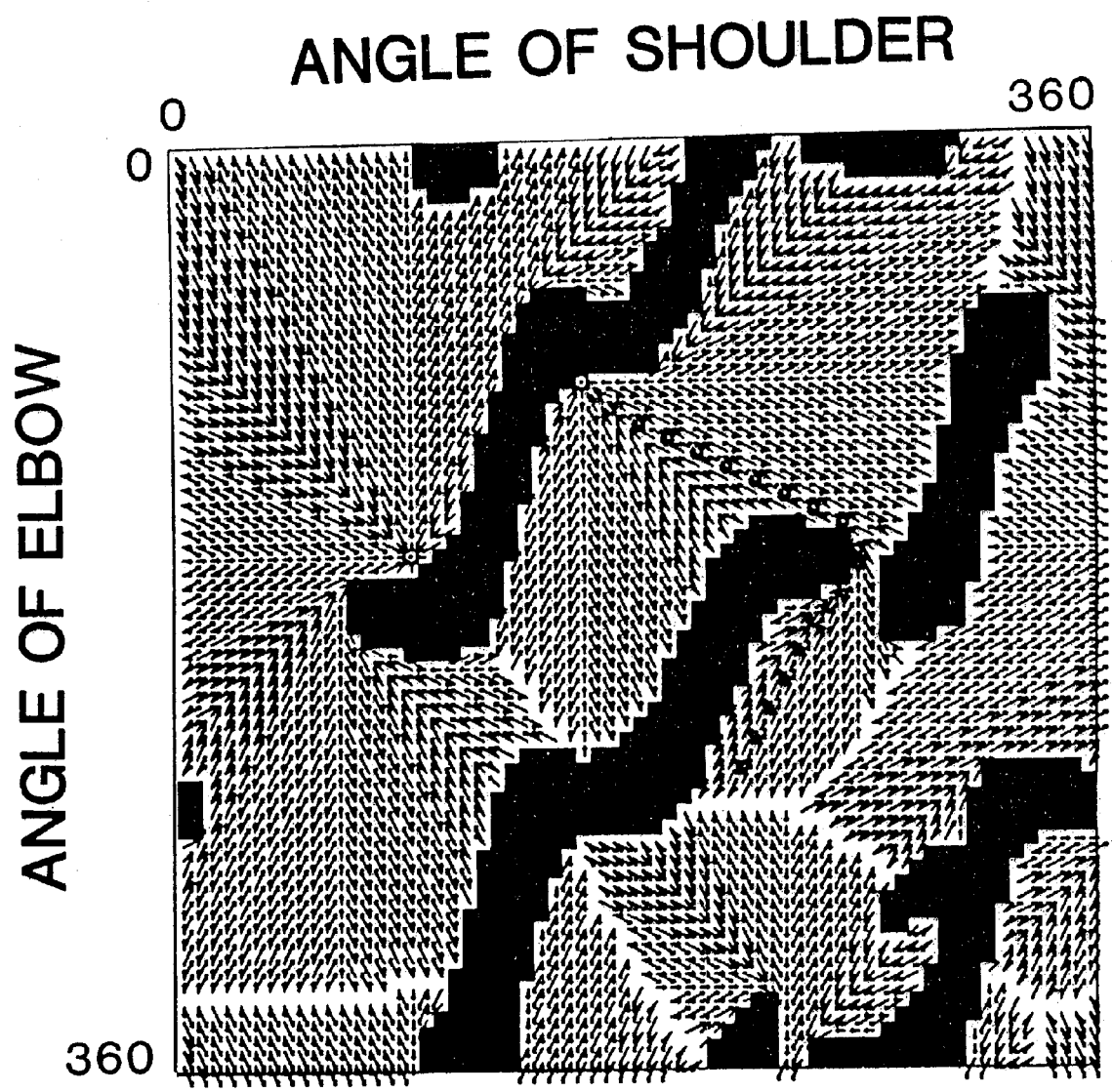
Figure 39:
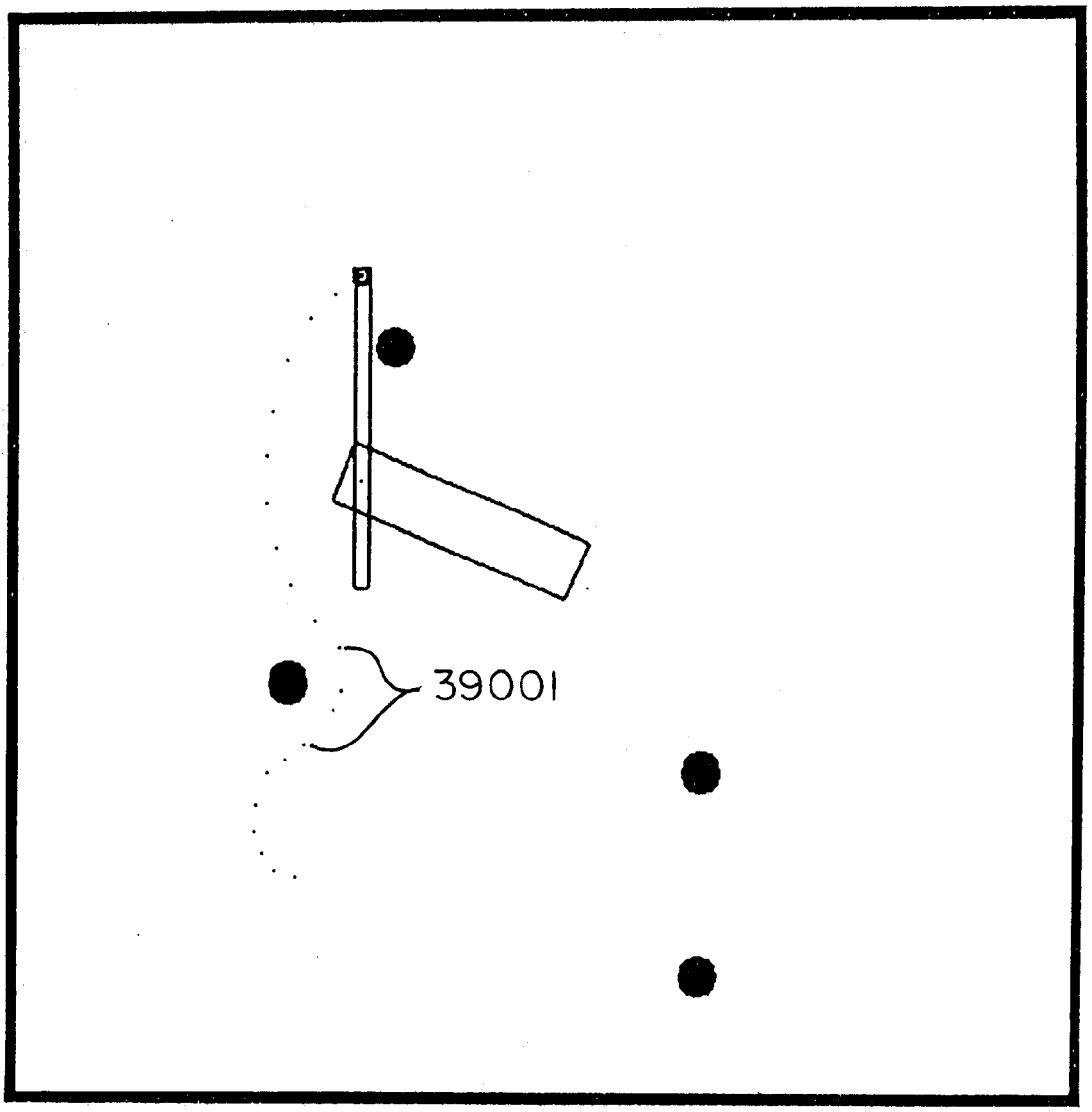

FIG. 38 shows the configuration space corresponding to the same task space as FIG. 32, but using the metric of Eq. (1). FIG. 39 shows the path 39001 found using the configuration space of FIG. 38.

Another important criterion for optimization is "minimum time", A path minimizing time can also be planned for a robot in its configuration space, if the speed with which the robot moves in a particular configuration is known. The time the robot takes to make a transition from state (i,j) in the direction ($\overline{di,dj}$) can be used as the cost for that transition. The minimal cost paths found by the method are then minimum time paths.

For a special case, one can compute minimum time paths in configuration space. Suppose that the robot has such powerful motors that they can drive the joint at maximum joint velocity all the time. This velocity may be different for each joint. Let the maximum velocity for the upper arm be $V_1$, and for the lower arm $V_2$. Then the time it takes to make a transition from (i,j) by direction_arrow (di,dj) is:

$$c(i, j, di, dj) = \max\left\{\frac{|di|}{V_1}, \frac{|dj|}{V_2}\right\} \quad \text{Eq. (3)}$$

If this is used as the metric function, then the method will produce minimum time paths.

It will be clear from these examples that diverse metrics in configuration space can be employed to handle a diversity of optimization criteria.

Task dependent constraints can also be accommodated. For example, in carrying a cup containing a liquid, it is important that the cup not be tilted too much. In the configuration space, the states corresponding to a configuration of too much tilt can be made into obstacle regions. They do not correspond to physical obstacles in task space, but to constraints dependent on the task. The transition costs are progressively increased according to their proximity to obstacles regions imposed by the constraints. Such transition costs lead to a tendency to keep the cup upright. This metric will allow the robot to deviate slightly from an upright position, if this is needed for obstacle avoidance, with a tendency to return to the upright position.

E. More Complicated Robots

Figure 40:
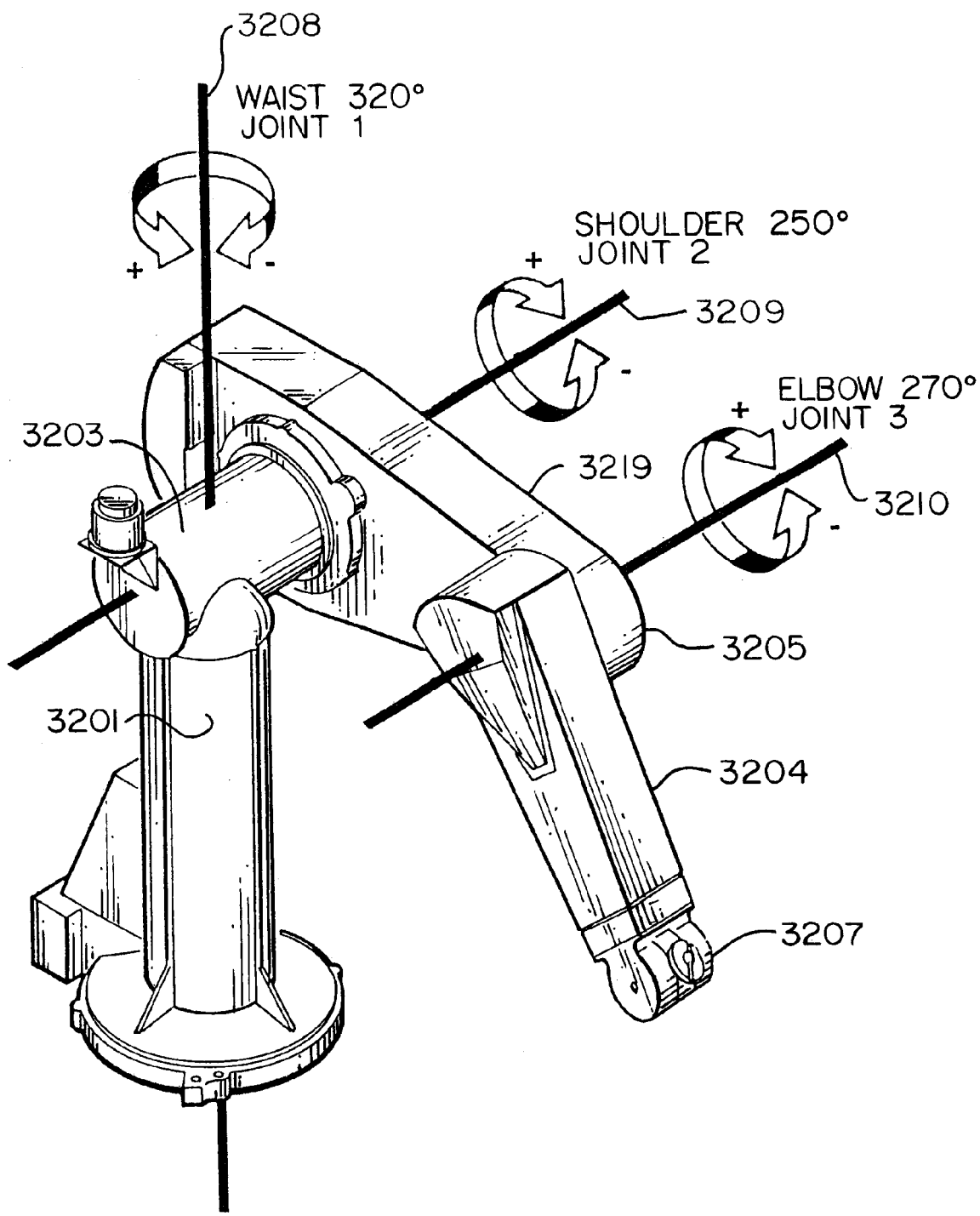
FIG. 40 shows a three-link robot.

FIG. 40 illustrates a three-link robot with three rotational degrees of freedom. The robot has a waist 3201, a shoulder 3203, an upper arm 3219, a forearm 3204, an elbow 3205, and an end effector 3207. FIG. 40 also illustrates the waist angle 3208, the shoulder angle 3209, and the elbow angle 3210.

Figure 41:
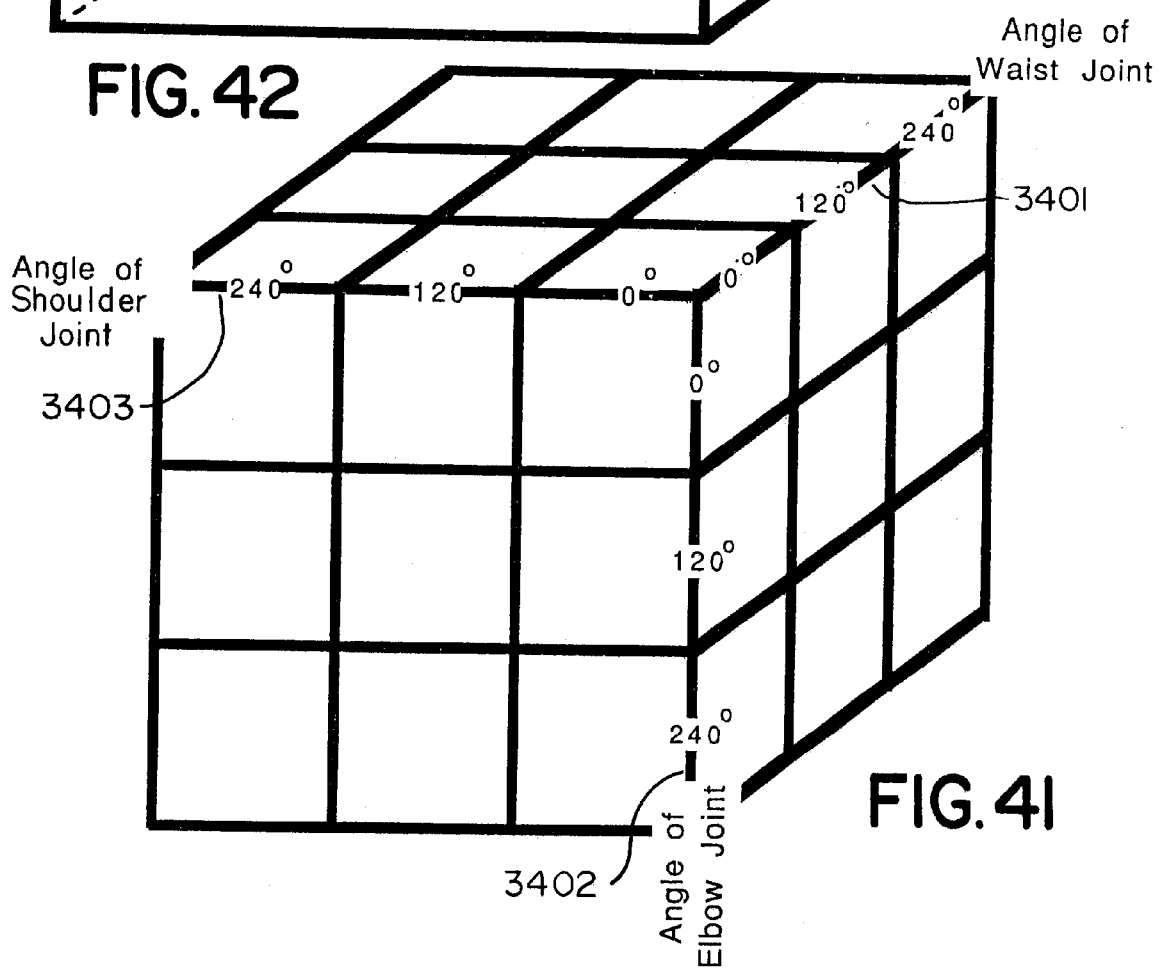
FIG. 41 shows a coarsely discretized three dimensional configuration space.

FIG. 41 illustrates a coarse three-dimensional configuration space corresponding to three rotational degrees of freedom. This configuration space corresponds to the robot of FIG. 40; however it could equally well be used for any robot with three rotational degrees of freedom. The configuration space has three axes: angle of waist 3401, angle of elbow 3402, and angle of shoulder 3403. The axes are divided into units of 120°. Thus the coarse configuration space has 27 states (0°,0°,0°), (0°,0°,120°), (0°,0°,240°),| (120°, 0°, 0°), (120°,0°,120°), (120°,0°,240°),| (240°,0°,0°), (240°,0°,120°), (240°,0°,240°),| (0°,120°,0°), (0°,120°,120°), (0°,120°,240°),| (120°,120°,0°), (120°,120°,120°), (120°,120°,240°),| (240°,120°,0°), (240°,120°,120°), (240°, 120°,240°),| (0°,240°,0°), (0°,240°,120°), (0°,240°,240°)| (120°,240°,0°), (120°,240°,120°), (120°,240°,240°)| (240°, 240°,0°), (240°,240°,120°), (240°,240°,240°).| As discussed above, rotational degrees of freedom are periodic. Therefore 360° on any axis is the same as 0° on that axis.

Figure 42:
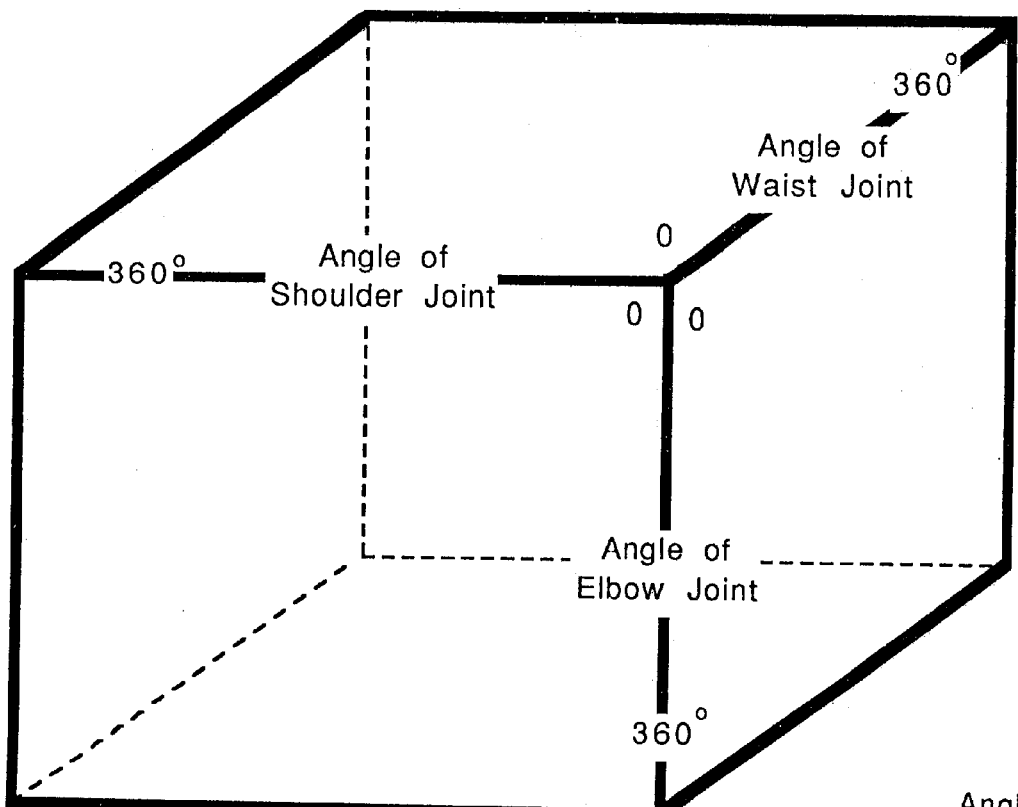
FIG. 42 shows a three dimensional configuration space.

FIG. 42 illustrates a fine configuration space. Here the demarcations between states are too small to fit in the scale of the figure.

The structure of the states in the three dimensional configuration spaces is the same as for the two dimensional configuration space. In other words, each state has a cost__to__goal field and a direction__arrows field; the principal difference being that the set of permissible directions of travel, direction arrows, is different in three dimensions from two dimensions. One set of possible direction arrows is {($\overline{0,0,1}$), ($\overline{0,0,-1}$),($\overline{0,1,0}$), ($\overline{0,-1,0}$), ($\overline{1,0,0}$), ($\overline{-1,0,0}$)} {(right), (left), (up), (down), (forward), (backward)} which would allow for no diagonal motion. These direction arrows may be characterized as being parallel to the axes of the configuration space. Another set of direction arrows would be {($\overline{0,0,1}$), ($\overline{0,0,-1}$),($\overline{0,1,0}$), ($\overline{0,-1,0}$), ($\overline{1,0,0}$), ($\overline{-1,0,0}$), ($\overline{0,1,1}$), ($\overline{0,-1,1}$), ($\overline{1,0,1}$), ($\overline{-1,0,1}$), ($\overline{0,1,-1}$), ($\overline{0,-1,-1}$), ($\overline{1,0,-1}$), ($\overline{-1,0,-1}$), ($\overline{1,1,0}$), ($\overline{-1,1,0}$), ($\overline{1,-1,0}$), ($\overline{-1,-1,0}$), ($\overline{1,1,1}$), ($\overline{1,1,-1}$), ($\overline{1,-1,1}$), ($\overline{-1,1,1}$), ($\overline{1,-1,-1}$), ($\overline{-1,1,-1}$), ($\overline{-1,-1,1}$), ($\overline{-1,-1,-1}$)}. This would allow for motion to all states within a cube of 3 states on a side surrounding the given state. The possible set of direction arrows which would include the equivalent of the knight's move is too long to list conveniently, but anyone with a passing familiarity with permutations can easily generate this set. This last set may be characterized as lying in a cube of five states on a side surrounding the given state, with redundant states removed. It is noted for instance that ($\overline{2,2,2}$) is redundant with ($\overline{1,1,1}$). Therefore ($\overline{2,2,2}$) need not be considered. In general this sort of set of neighbors has been described in mathematics as the set of "visible" points in an n-cube with p states on a side.

Given the configuration space of FIG. 42, paths can be planned for three degrees of freedom using the method illustrated in the flowcharts of FIG. 1a and FIG. 1b and explained above. It is noted that box 17 of FIG. 1b will be affected by the number of degrees of freedom, because more neighbor states are generally used and will therefore have to be checked for each top state when the number of degrees of freedom increases.

To pass into more degrees of freedom is a simple extension of the principles discussed above.

F. Other Kinds of Applications

The previous examples have related to robots. However, robots are not the only objects which can be directed using the method of FIG. 1b.

1. Paths for Emergency Vehicles and Electronic Maps

For instance, the configuration space of FIG. 2 might equally well apply to a task space which is a city street map. The method of FIG. 1b could then be employed to plot the path of an emergency vehicle through the streets. A metric for this application should reflect the time necessary to travel from one point to another. One-way streets would have a certain time-cost for one direction and infinite cost in the illegal direction. Highways would generally have a lower time-cost than small side streets. Since highway blockages due to accidents, bad weather, or automobile failure are commonly reported by radio (broadcast and police) at rush hour, this information might be used as an input to increase expected time-costs on those constricted routes. This would result in the generation of alternate routes by the path planner.

The method of FIGS. 1a and 1b could also be employed with the city street task space to generate electronic maps for automobiles.

2. Emergency Exits From Buildings

Dynamic emergency exit routes can be obtained for buildings that report the location of fire or other emergency. The currently used fixed routes for emergency exits can lead directly to a fire. A dynamic alarm system can report the suspected fire locations directly to a path planning device according to the invention. The path planning device can then light up safe directions for escape routes that lead away from the fire. In this case, the safest escape route may be longer, but away from the fire. In this case 'safety' is the criterion.

3. General Applicability to Numerical Methods

From a mathematical point of view, the method of the present invention finds a discrete approximation to the set of all geodesics perpendicular to a set of goal points in a space variant metric. "Following the direction arrows" is analogous to following the intrinsic gradient. Following the direction arrows from a specific start state yields the geodesic connecting the start state to the closest goal state. A device incorporating this method could be applied to the solution of any problem which requires the finding of such a geodesic.

G. Shortcuts

A number of techniques may be devised to improve the efficiency of the method described with respect to FIGS. 1a and 1b.

One efficiency technique will be referred to herein as early path detection. The early path detection feature makes use of the fact that as soon as the cost waves have been propagated just beyond the starting state, the optimal path can be reported, since no further budding changes will affect the region between the start and goal.

Figure 43:
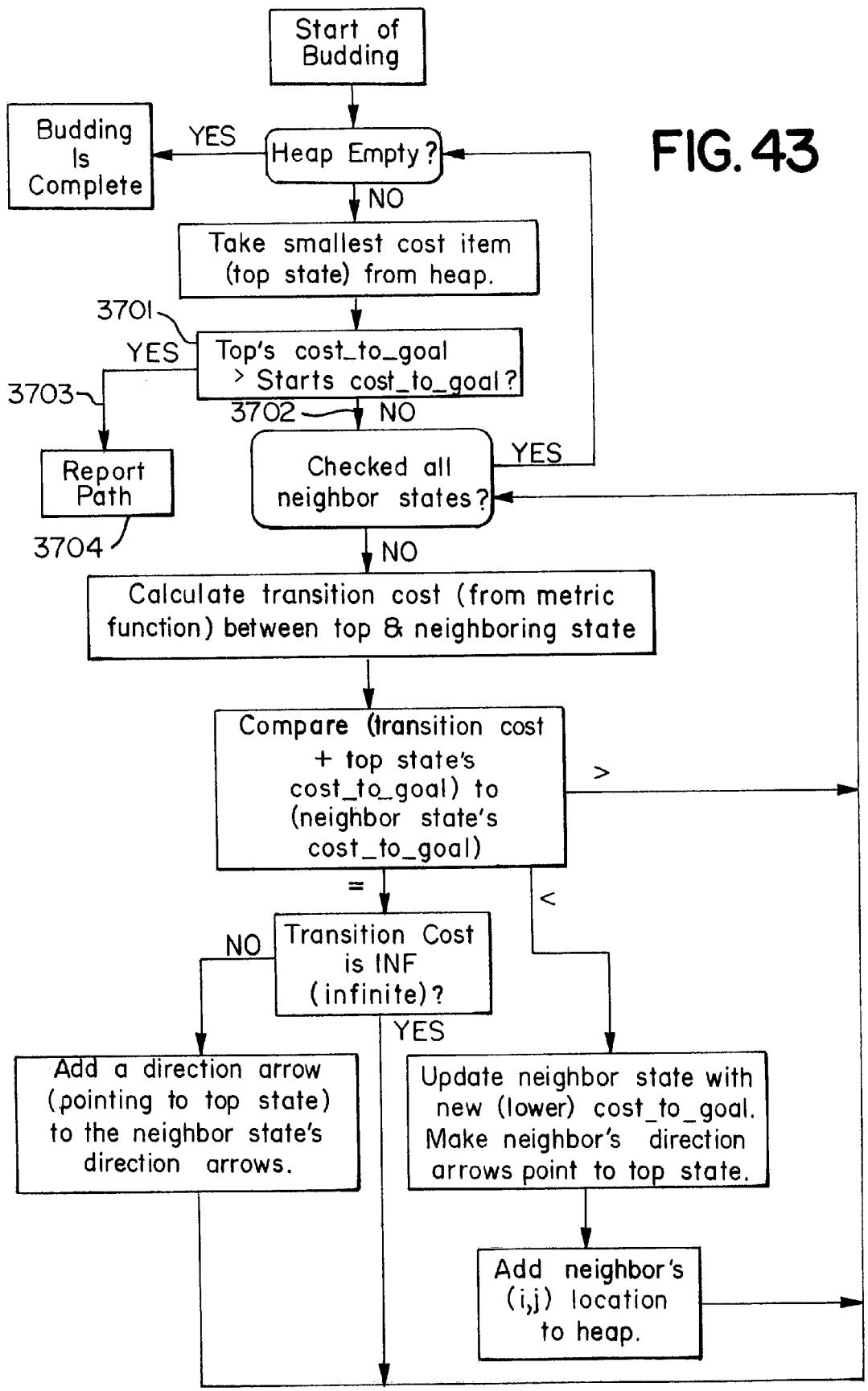
FIG. 43 is a flow chart of an alternate embodiment of the method of path planning.

FIG. 43 shows the additional steps necessary for early path reporting. FIG. 43 is the same as FIG. 1b, except that several steps have been added. In box 3701, the method tests whether the value of the cost_to_goal field of the state at the top of the heap is greater than the cost_to_goal field of the start state. If the result of the test of box 3701 is negative, budding continues as usual, along branch 3702. If the result of the test of box 3701 is positive, the method follows branch 3703 to box 3704 where the path is reported. After the path is reported at box 3704, normal budding continues. It is possible to stop after this early detection if the entire cost field is not needed.

Figure 44:
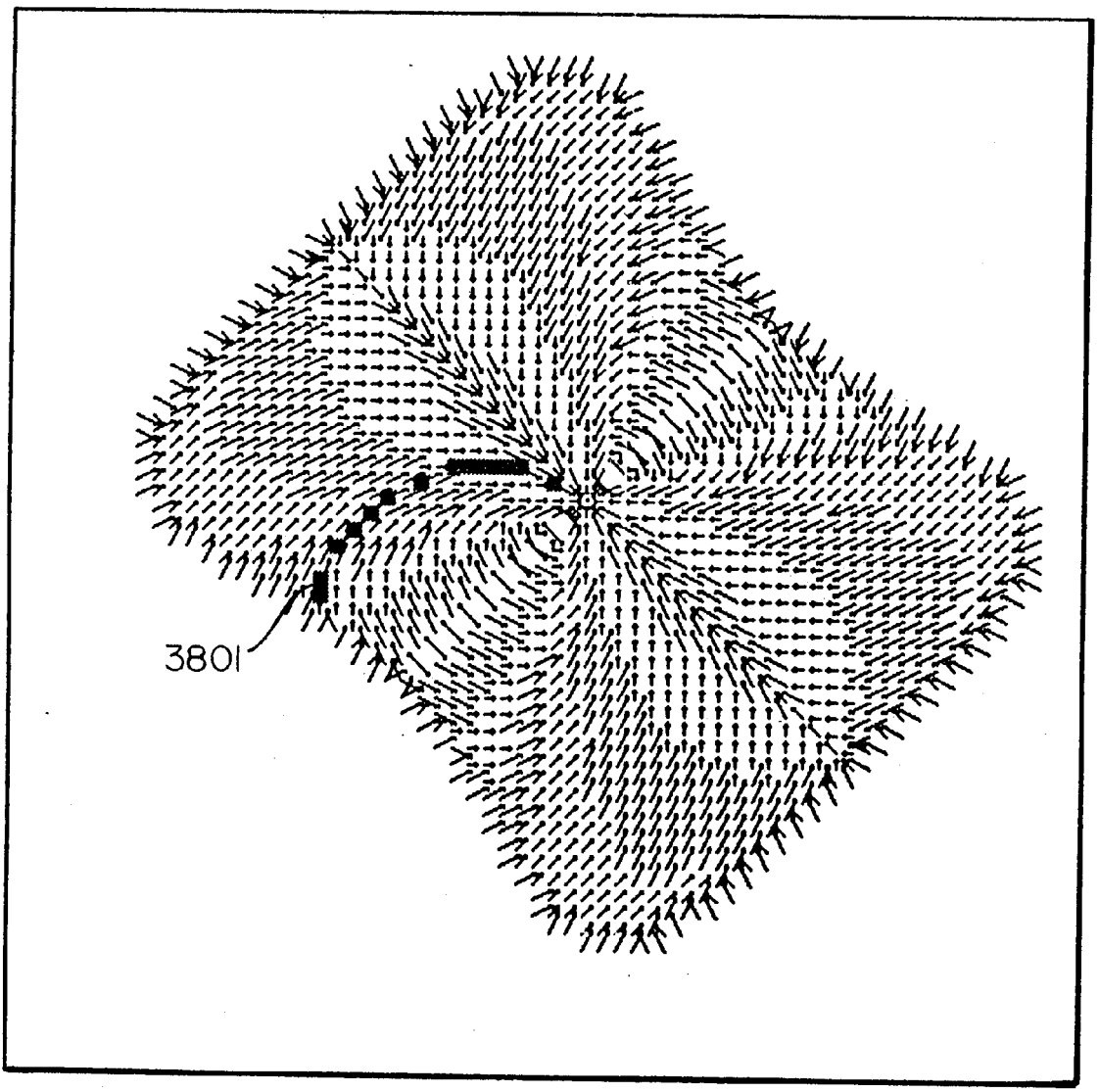
FIG. 44 shows a configuration space budded according to the method of FIG. 43.

FIG. 44 shows an example of configuration space in which the path 3801 has been reported prior to the 'normal' termination of budding.

It is noted that this kind of early path detection is not possible if a queue structure is used during budding, instead of heap because using a queue structure the shortest path cannot be determined until the entire configuration space is budded.

Another efficiency technique is to begin budding from both the goal and the start states. The path then is found when the expanding cost waves meet. Usually, a different metric must be used for budding the start state from that which is used for budding the goal states. This results from the fact that budding out from the start state would be in the actual direction of motion in the task space which is essentially calling the same metric function with the top and neighbor states swapped. By contrast, budding from the goal states is in a direction opposite to motion in the task space.

We claim:

1. A method for determining at least one physical motion specification for a physical object comprising executing the following steps in at least one digital data processing device and at least one computer readable storage medium that is included in or coupled with the at least one digital data processing device:
    a) embodying, in the at least one computer readable storage medium, a configuration space data structure representing a physical task space that surrounds the physical object in physical reality, the configuration space data structure including signals representing the physical object and the physical task space; and
    b) propagating cost waves, in the configuration space data structure, to fill the configuration space data structure with cost values according to a space variant metric, the cost values representing physical aspects of the physical task space with respect to physical motion of the physical object.

2. The method of claim 1, further comprising the steps of:
    a. deriving a series of object pose representations within the configuration space data structure, using the cost values, which representations represent physical poses defining a least cost path from a start pose to a goal pose in the physical task space; and
    b. providing the series in an electronic form usuable by the object to follow the path.

3. The method of claim 1 wherein
    the method is a part of a method for controlling the object; and
    the method further comprises the step of controlling the object to follow the path.

4. A method for determining at least one physical motion specification for a physical object comprising executing the following steps in at least one digital data processing device and at least one computer readable storage medium that is included in or coupled with the at least one digital data processing device:
    a) embodying, in the at least one computer readable storage medium, a configuration space data structure representing a physical task space that surrounds the physical object in physical reality, the configuration space data structure including signals representing the physical object and the physical task space environment, the configuration space data structure including a plurality of states which are data structures representing physical poses of the physical objects; and
    b) propagating cost waves in the configuration space data structure, said propagating step comprising the steps of:
        I) exploring all neighbors of a state in the configuration space data structure;
        ii) improving neighbors of the state by assigning appropriate values of cost to goal and direction arrows to the state, which cost to goal and direction arrows values represent physical aspects of the physical task space and the physical motion; and
        iii) adding improved neighbors to a storage data structure.

5. The method of claim 4 further comprising the steps of:
    a. deriving a series of object pose representations within the configuration space data structure, using the cost values, which representations represent physical poses defining a least cost path from a start pose to a goal pose in the physical task space; and
    b. providing the series in an electronic form usable by the object to follow the path.

6. A method as claimed in claim 4, further comprising the following steps
    a. first transforming a physical goal pose into signals of at least one goal state in the configuration space data structure;
    b. assigning cost and direction arrow values to states in the configuration space data structure so that each respective reachable state is assigned a cost value which represents the cost of an optimal path from the respective state to the goal state, and so that each respective reachable state is assigned at least one direction arrow value which represents a direction of travel on the optimal path;
    c. second transforming the physical start pose into signals of a start state;
    d. following the direction arrows from the start state to the goal state to obtain a series of object pose representations within the configuration space data structure, which representations represent physical poses defining a least cost path from the start pose to the goal pose in the physical task space.

7. The method of claim 6 comprising the steps of:
    a) determining, after the second transforming step, whether the path exists, a path existing when there is at least one direction arrow value for the start state; and
    b) stopping the method after the determining step, when no path exists.

8. The method of claim 6 further comprising, prior to the first providing step, the step of: choosing a value which represents a coarseness of the configuration space data structure.

9. The method of claim 6 comprising the step of interactively choosing a set of possible direction arrows values.

10. The method of claim 6 wherein the assigning step comprises choosing the direction arrow values from a set comprising direction arrows values representing transitions parallel to axes of the configuration space corresponding to the configuration space data structure.

11. The method of claim 6 wherein the assigning step comprises choosing the direction arrow values from a set comprising direction arrow values representing transitions from a first state to respective ones of a plurality of second states, which second states are the visible states in an n-cube of p states on a side, the n-cube surrounding the first state, where n is a positive integer representing a number of degrees of freedom of the object and p is a positive integer.

12. The method of claim 6 wherein the assigning step includes measuring cost values of transitions between neighboring states with a metric.

13. The method of claim 12 comprising the step of inducing the metric derived from a criterion.

14. The method of claim 13 comprising the step of using the criterion of minimizing time of motion in the task space.

15. The method of claim 13 wherein the object is a robot with movable joints and comprising the step of using the criterion of minimizing joint motion of the robot.

16. The method of claim 13 comprising the step of using the criterion of minimizing distance of motion in the task space.

17. The method of claim 6 wherein the assigning step comprises evaluating cost according to a space variant metric function.

18. The method of claim 5 wherein the assigning step comprises evaluating cost according to a space variant metric function wherein constrained points in the physical task space are expressed as requiring higher cost transitions in the configuration space data structure.

19. The method of claim 6
comprising the further step of third transforming at least one further physical goal pose into corresponding further goal states in the configuration space data structure;
wherein the assigning step comprises assigning cost and direction arrow values which represent cost and direction of an optimal path from the respective state to a least cost one of the goal states; and
wherein the following step comprises following the direction arrows from the start state to the least cost one of the goal states.

20. The method of claim 6
comprising the step of third transforming at least one physical obstacle in the physical task space into at least one obstacle state in the configuration space data structure; and
wherein the assigning step comprises assigning cost and direction arrows values so that each optimal path avoids the at least one obstacle state and so that the at least one obstacle state has no direction arrow values;
whereby the following step results in a path which avoids the obstacle.

21. The method of claim 20 wherein the third transforming step comprises assigning a substantially infinite value of cost to the obstacle state, whereby the obstacle state becomes part of a space variant metric function which measures cost.

22. The method of claim 6 wherein
the method is a part of a method for controlling the object; and
the method further comprises the step of controlling the object to follow the path.

23. The method of claim 6 wherein the assigning step includes:
adding the states to a heap,
retrieving a top node representing a lowest cost node,
expanding the top node to determine the improved neighbors, and
adding the improved neighbors to the heap.

24. The method of claim 23 wherein the adding steps each include checking a flag in the configuration space data structure to determine if the state is already in the heap before the respective states or improved neighbors are added to the heap.

25. The method of claim 4 wherein
the method is a part of a method for controlling the object; and
the method further comprises the step of controlling the object to follow the path.

26. Apparatus for determining at least one physical motion specification for a physical object, the apparatus comprising:
a. a memory for storing signals representing a discretized configuration space in the form of a configuration space data structure which includes a plurality of states corresponding to a discretized subset of all physical poses of the physical object in a physical task space, the states being arranged so that each state has a plurality of neighboring states situated along respective permissible transition directions;
b. means for initializing the states;
c. means for storing goal information, corresponding to a physical goal pose, in a respective goal state;
d. means for measuring cost of transition from each state to its neighboring states along the permissible directions according to a space variant metric function;
e. means for propagating cost waves from the goal state using the measuring means, the propagating means assigning to each state a cost value and a direction of travel corresponding to a physical least cost path from the physical pose corresponding to the state to the physical goal pose;
f. means for determining a series of discrete states along the physical path, the determining means determining the path states by starting at a start state corresponding to a physical start pose and following the cost and direction of travel values assigned to the start state and succeeding states; and
g. means for transforming the series into an electronic form usable by the physical object to follow the physical path.

27. The apparatus of claim 26 wherein:
a. the object is a robot; and
b. the discrete states along the path correspond to set points of the robot.

28. The apparatus of claim 26 wherein:
a. the object is an emergency vehicle;
b. the discrete states along the path correspond to street locations to which the emergency vehicle should travel; and
c. the apparatus comprises means for transmitting the discrete states to a driver of the emergency vehicle.

29. The apparatus of claim 26 wherein:
a. the apparatus is an emergency alarm system in a building;
b. the object is a person trying to escape from the building;
c. the path represents a safest way out of an emergency situation; and
d. the apparatus comprises means for communicating the path to the person.

30. The apparatus of claim 26 wherein:
a. the apparatus is an electronic map;
b. the object is a person attempting to find a route in a new area; and
c. the discrete states correspond to street locations to which the person should travel.

31. The apparatus of claim 26 wherein
the apparatus is part of a controller for the object; and
the apparatus further comprises means for controlling the object to follow the path.

32. Apparatus for planning a physical least cost path comprising:
a) at least one computer readable storage medium for storing signals embodying a discretized data structure representation of a physical task space, which physical task space surrounds the physical object in physical reality;
b) means for assigning at least one respective cost to at least one neighboring position of any given position, based on I) a cost assigned to the given position; and ii) a measure which varies according to position within the discretized representation, the cost corresponding to at least one physical aspect of the physical task space, so that a physical least cost path from the neighboring position to the given position is established;
c) means for starting the assigning means at a first position of known cost;
d) means for causing the assigning means to iterate, so that all positions within the discretized representation are assigned respective costs, in waves propagating outward from the first position; and
e) means for identifying a least cost path between two positions in the discretized representation based on the respective costs.

* * * * *